US010903790B1

(12) United States Patent
Jin et al.

(10) Patent No.: US 10,903,790 B1
(45) Date of Patent: Jan. 26, 2021

(54) FREQUENCY REFERENCE GENERATOR

(71) Applicant: NXP B.V., Eindhoven (NL)

(72) Inventors: Yanyu Jin, Eindhoven (NL); Jos Verlinden, Wachtendonk (DE); Maoqiang Liu, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/886,030

(22) Filed: May 28, 2020

(51) Int. Cl.
*H03B 5/12* (2006.01)
*H03L 1/02* (2006.01)
(Continued)

(52) U.S. Cl.
CPC ............. *H03B 1/02* (2013.01); *H03B 5/1212* (2013.01); *H03B 5/1215* (2013.01); *H03B 5/1228* (2013.01); *H03B 5/1265* (2013.01); *H03B 5/1271* (2013.01); *H03L 1/02* (2013.01); *H03L 7/099* (2013.01)

(58) Field of Classification Search
CPC .......... H03B 1/02; H03B 5/12; H03B 5/1206; H03B 5/1212; H03B 5/1215; H03B 5/1228; H03B 5/1231; H03B 5/124; H03B 5/1243; H03B 5/1246; H03B 5/125; H03B 5/1253; H03B 5/1256; H03B 5/1262;
(Continued)

(56) References Cited

U.S. PATENT DOCUMENTS 6,091,304 A * 7/2000 Harrer ...................... H03L 7/10
331/10
6,097,258 A * 8/2000 Van Veenendaal ..........................
H03B 5/1243
331/117 R (Continued)

OTHER PUBLICATIONS

McCorquodale, M. S. et al., "A 0.5-to-480MHz Self-Referenced CMOS Clock Generator with 90ppm Total Frequency Error and Spread-Spectrum Capability," IEEE International Solid-State Circuits Conference (ISSCC), Feb. 2008, pp. 350-351 and 619.

(Continued)

*Primary Examiner* — Levi Gannon
(74) *Attorney, Agent, or Firm* — Rajeev Madnawat

(57) ABSTRACT

An LC oscillator has a tank driver connected to cause a matched-resistance LC tank to oscillate. The LC tank has an inductor leg in parallel with a capacitor leg. The inductor leg has an explicit inductor having an implicit resistance level $R_L$. The capacitor leg has an explicit capacitor having an implicit resistance level $R_C$ connected in series with an explicit resistor having an explicit resistance level $R_R$, where $R_M = (R_C + R_R)$ is substantially equal to $R_L$. The LC oscillator may have a non-trimmable LC tank and be part of a temperature-compensated frequency reference generator having standalone frequency adjustment circuitry that offers better than ±0.1% frequency accuracy (after single trim and batch calibration) over process, voltage, and temperature variations, and lifetime, which can serve as a low-cost replacement for a crystal oscillator for many applications.

15 Claims, 19 Drawing Sheets

(51) Int. Cl.
*H03B 1/02* (2006.01)
*H03L 7/099* (2006.01)

(58) Field of Classification Search
CPC .. H03B 5/1265; H03B 5/1268; H03B 5/1271; H03L 1/02
USPC ................................ 331/117 FE, 117 R, 167
See application file for complete search history.

(56) References Cited

U.S. PATENT DOCUMENTS

| | | | |
|---|---|---|---|
| 7,030,718 B1* | 4/2006 | Scherer | H03J 3/20 331/117 R |
| 7,777,585 B1* | 8/2010 | Sonntag | H03L 1/02 331/176 |
| 7,872,541 B2 | 1/2011 | McCorquodale et al. | |
| 8,884,718 B2 | 11/2014 | Sinoussi et al. | |
| 2001/0015681 A1* | 8/2001 | Hino | H03B 5/1215 331/117 R |
| 2003/0193372 A1* | 10/2003 | Huang | H03B 5/1215 331/100 |
| 2004/0092242 A1* | 5/2004 | Endo | H04B 1/406 455/264 |
| 2005/0206460 A1* | 9/2005 | Korner | H03B 5/1228 331/36 C |
| 2007/0176705 A1 | 8/2007 | Sutardja | |
| 2011/0018642 A1* | 1/2011 | Li | H03B 5/1228 331/108 R |
| 2012/0200364 A1* | 8/2012 | Iizuka | H03L 1/026 331/117 FE |
| 2017/0179961 A1 | 6/2017 | Itasaka | |
| 2018/0198451 A1 | 7/2018 | Jung et al. | |
| 2018/0241401 A1 | 8/2018 | Aylward | |
| 2018/0323316 A1* | 11/2018 | Konkapaka | H01L 29/93 |
| 2019/0028106 A1 | 1/2019 | Annema et al. | |
| 2019/0109574 A1* | 4/2019 | Ilkov | H03F 1/565 |
| 2020/0343856 A1 | 10/2020 | Aboudina et al. | |

OTHER PUBLICATIONS

Ates, E. O. et al., "Fully Integrated Frequency Reference With 1.7 ppm Temperature Accuracy Within 0-80° C.," IEEE Journal of Solid-State Circuits, Nov. 2013, pp. 2850-2859, vol. 48, No. 11.
Greiner, P. et al., "A System-on-Chip Crystal-Less Wireless Sub-GHz Transmitter," IEEE Transactions on Microwave Theory and Techniques, Mar. 2018, pp. 1431-1439, vol. 66, No. 3.
Gaied, D. et al., "A CMOS LC-Based Frequency Reference with ±40ppm Stability from -40° C. to 105° C.," 2015 Joint Conference of the IEEE International Frequency Control Symposium & the European Frequency and Time Forum, 2015, pp. 151-154, Denver, US.
Groszkowski, J., "The Interdependence of Frequency Variation and Harmonic Content, and the Problem of Constant-Frequency Oscillators," Proceedings of the Institute of Radio Engineers, Jul. 1933, pp. 958-981, vol. 21, No. 7.
McCorquodale, M. S. et al., "A Silicon Die as a Frequency Source", 2010 IEEE International Frequency Control Symposium, Jun. 2010, pp. 103-108.
Non-Final Rejection for U.S. Appl. No. 16/804,245, 10 pgs. (dated Nov. 20, 2020).

* cited by examiner

FREQUENCY REFERENCE GENERATOR

TECHNICAL FIELD

The present disclosure is related to electronics and more particularly to circuitry for generating frequency reference signals.

BACKGROUND

Bulky and relatively expensive quartz crystal oscillators, which can offer ppm-level accuracy over temperature and lifetime, are generally adopted for applications requiring absolute frequency accuracy better than ±0.1%. In an attempt to move to fully integrated solutions on silicon, several on-chip LC-based frequency references have been published that employ passive and active on-chip components in the processing front-end. See, for example:

M. S. McCorquodale et al., "A 0.5-to-480 MHz Self-Referenced CMOS Clock Generator with 90 ppm Total Frequency Error and Spread-Spectrum Capability," 2008 *IEEE International Solid-State Circuits Conference—Digest of Technical Papers*, San Francisco, Calif., 2008, pp. 350-619;

M. S. McCorquodale et al., "A silicon die as a frequency source," 2010 *IEEE International Frequency Control Symposium*, Newport Beach, C A, 2010, pp. 103-108;

D. Gaied et al., "A CMOS LC-based frequency reference with ±40 ppm stability from −40° C. to 105° C.," 2015 *Joint Conference of the IEEE International Frequency Control Symposium & the European Frequency and Time Forum*, Denver, Colo., 2015, pp. 151-154;

U.S. Pat. No. 7,872,541; and

U.S. Pat. No. 8,884,718, the teachings of all of which are incorporated herein by reference in their entirety. However, passive and active on-chip components in the processing front-end have a significant process spread as well as large temperature and lifetime dependency. As such, to achieve absolute frequency accuracy, temperature trimming and re-trimming are employed over time. To realize a low-cost, high-accuracy, integrated frequency reference generator, minimizing process spread of frequency temperature dependency (TC) and maintaining frequency stability over lifetime are critical.

U.S. patent application Ser. No. 16/804,245, the teachings of which are incorporated herein by reference in their entirety, describes a high-accuracy, integrated frequency reference generator having a frequency source based on a Colpitts oscillator having a non-trimmable LC tank. It is desirable to provide a high-accuracy, integrated frequency reference generator having a frequency source based on a non-Colpitts oscillator having a non-trimmable LC tank.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Frequency Reference Generator

Figure 1:
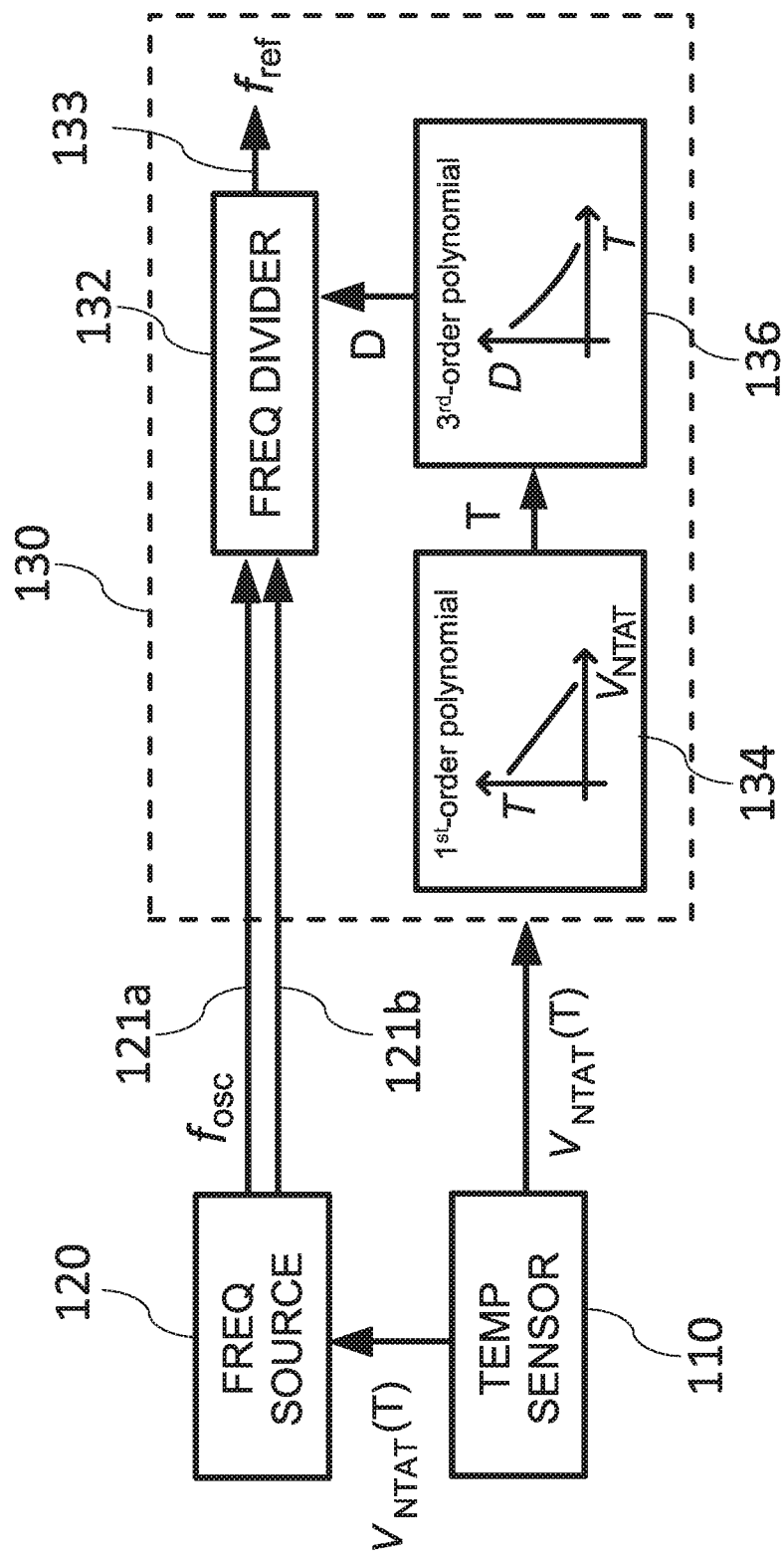
FIG. 1 is a high-level block diagram of a frequency reference generator according to certain embodiments of the disclosure.

FIG. 1 is a high-level block diagram of a frequency reference generator 100, according to certain embodiments of the disclosure. Frequency reference generator 100 has a temperature sensor 110, a frequency source 120, and frequency-adjustment circuitry 130, where a temperature measurement generated by the temperature sensor 110 is used to improve the stability of the frequency of the frequency source 120 and to control the operations of the frequency-adjustment circuitry 130. In particular, the temperature sensor 110 generates a DC voltage $V_{NTAT}(T)$ whose voltage level is dependent on the operating temperature of the frequency reference generator 100. Based on this sensed-temperature voltage $V_{NTAT}(T)$, the frequency source 120 generates a differential oscillator signal 121a/b having an oscillator frequency $f_{osc}$. Note that, although the frequency source 120 can function without the temperature sensor 110, as described further below, the sensed-temperature voltage $V_{NTAT}(T)$ enhances the oscillator performance of the frequency source 120 in terms of frequency stability. The frequency-adjustment circuitry 130 has a frequency divider 132 that divides the frequency $f_{osc}$ of the oscillator signal 121 by a divisor value D that is selected based on the sensed-temperature voltage $V_{NTAT}(T)$ to generate a frequency reference signal 133 having a desired reference frequency $f_{ref}$. Note that any reference frequency $f_{ref}$ lower than the oscillator frequency $f_{osc}$ can be generated by adjusting the divisor value. Depending on the implementation, the frequency reference signal 133 may be single-ended, differential, or multi-phase.

Depending on the implementation, one or more of the elements of the frequency reference generator 100 may be implemented using integrated circuitry. For example, in some implementations, the temperature sensor 110 and the frequency source 120 may be fully integrated on the same integrated circuit (IC) die. Some of those implementations may also have some or all of the frequency-adjustment circuitry 130, such as the frequency divider 132, integrated on that same IC die.

The processing used to select the divisor value D based on the sensed-temperature voltage $V_{NTAT}(T)$ is represented in FIG. 1 as a linear (i.e., first-order) mapping 134 from voltage $V_{NTAT}$ to temperature T followed by a third-order mapping 136 from temperature T to divisor value D. Note that the first mapping 134 is not necessarily limited to being first order, and the second mapping 136 is not necessarily limited to being third order. In certain implementations, when at least the temperature sensor 110 and the frequency source 120 are integrated on the same IC die, multiple samples (i.e., instances) of that IC die are factory tested at different temperatures over the full operating-temperature range for the frequency reference generator 100 to determine values of the divisor value D that achieve frequency reference signals 133 having the desired reference frequency $f_{ref}$ at those different temperatures for those multiple samples. That data is then used to generate a first-order, sample-agnostic mapping from $V_{NTAT}(T)$ to T and a third-order, sample-agnostic mapping from T to D for a generic IC die. For every subsequent sample of the IC die, the sample is factory tested at a specific temperature (e.g., a standard room temperature) to determine the sample-specific divisor value D that achieves the desired reference frequency $f_{ref}$ at that specific temperature. The difference between that sample-specific divisor value D value and the corresponding divisor value D at the same temperature in the third-order, sample-agnostic mapping is then applied to the sample-agnostic mapping to generate a sample-specific, third-order mapping for that specific sample that is used as the third-order mapping 136 of FIG. 1, while the sample-agnostic mapping from $V_{NTAT}(T)$ to T is used as the first-order mapping 134 of FIG. 1.

In some implementations, the two mappings 134 and 136 of FIG. 1 are implemented using suitable memory that contains a single, sample-specific look-up table (LUT) that maps different sensed-temperature voltages $V_{NTAT}(T)$ directly to corresponding divisor values D or an arbitrary number of concatenated mappings. Depending on the implementation, the LUT may be implemented on-chip or off-chip. In addition, interpolation processing may be implemented (on-chip or off-chip) to generate values of the divisor value D for intermediate voltage levels $V_{NTAT}(T)$ that are not explicitly represented in the LUT. Alternatively, instead of a LUT, the mappings 134 and 136 could be implemented using two closed-form equations that sequentially map $V_{NTAT}(T)$ to T and T to D or a single closed-form equation that maps $V_{NTAT}(T)$ directly to D.

In this way, the frequency reference generator 100 of FIG. 1 is factory-trimmed for process variations and field-compensated for temperature variations. In other words, an individual IC die sample of the frequency reference generator 100 is tested in the factory to generate a sample-specific LUT that takes into account process variations between different samples, where that sample-specific LUT is then used during on-line operations of that sample (i.e., in the field) to take into account differences in the performance of that sample as a function of operating temperature. As described further below, the frequency reference generator 100 also handles variation in power supply voltage level. As a result, the frequency reference generator 100 of FIG. 1 is substantially insensitive to expected process, voltage, and temperature (PVT) variations over the lifetime of the generator.

Note that, for some implementations, the same LUT may be able to be used for all of the samples manufactured on the same substrate wafer or for all of the samples manufactured during the same batch. In those cases, the LUT would be wafer-specific or batch-specific instead of sample-specific, where the wafer-specific or batch-specific 1T-trimmed LUT would be generated by factory testing a single sample for each wafer or batch. Furthermore, in some implementations, a single sample-agnostic LUT may be sufficient for all of the samples. In that case, no factory testing would be needed and the sample-agnostic LUT would be used with no trimming.

Temperature Sensor

Figure 2:
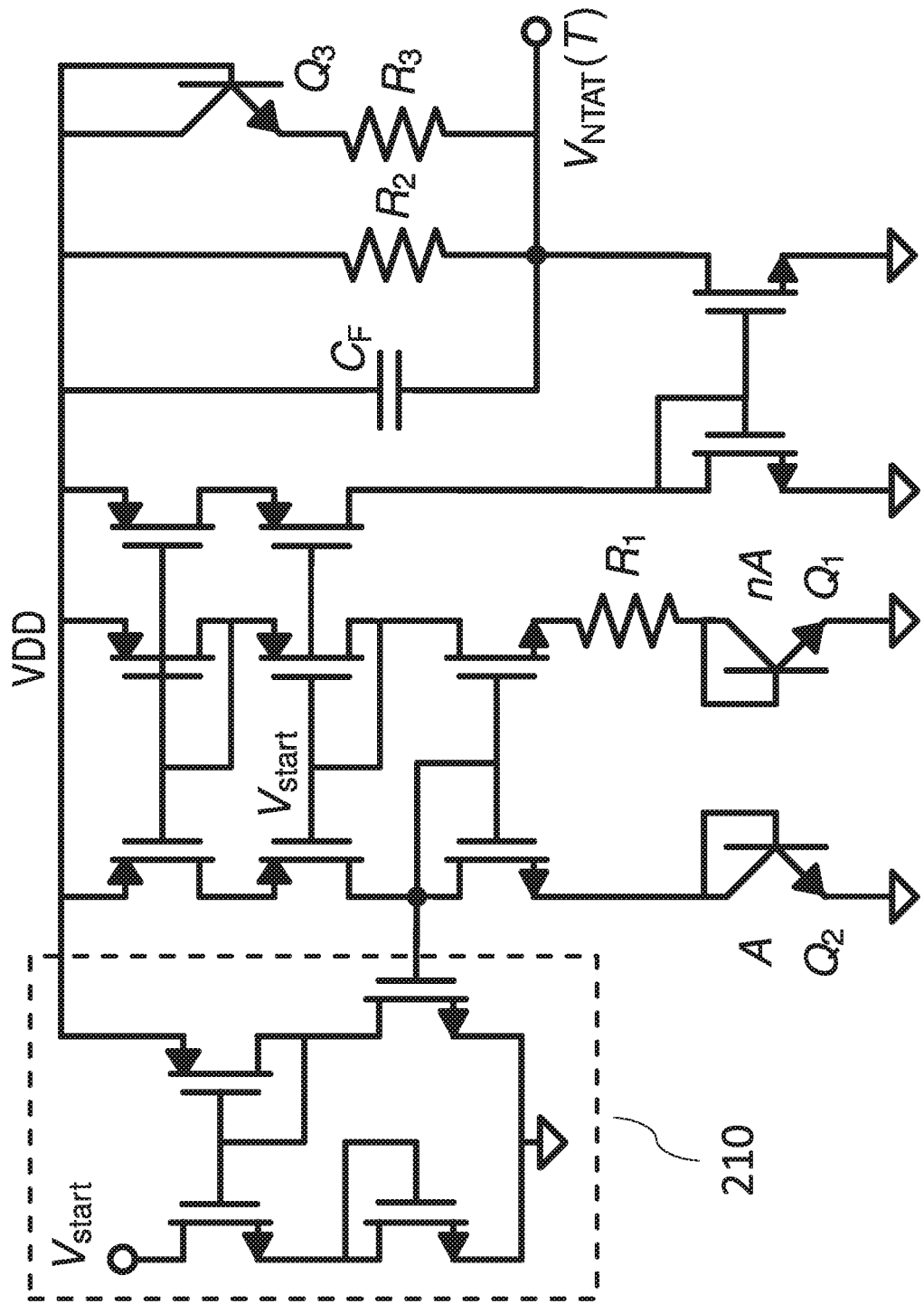
FIG. 2 is a schematic circuit diagram of a temperature sensor that can be used to implement the temperature sensor 110 of FIG. 1 according to certain embodiments of the disclosure.

FIG. 2 is a schematic circuit diagram of a temperature sensor 200 (including its start-up circuit 210) that can be used to implement the temperature sensor 110 of FIG. 1, according to certain embodiments of the disclosure. The temperature sensor 110 of FIG. 2 is an NTAT (negative to absolute temperature) sensor that generates the sensed-temperature voltage $V_{NTAT}(T)$ according to the following Equation (1):

$$V_{NTAT}(T) \approx V_{VDD} - \frac{R_3}{R_2+R_3}\left(\frac{R_2}{R_1}\frac{kT}{q}\ln(n) + \frac{R_2}{R_3}V_{BE,Q3}\right) \quad (1)$$

where $V_{VDD}$ is the supply voltage VDD, $R_1$, $R_2$, and $R_3$ are the resistances of the corresponding resistors, T is the absolute temperature in degrees Kelvin, k is the Boltzmann constant, q is the electron charge constant, n is the size ratio between the n-type bipolar transistors $Q_1$ and $Q_2$, and $V_{BE,Q3}$ is base-to-emitter voltage of the n-type bipolar transistor $Q_3$. A typical value for n is 8, although other suitable values are possible. The absolute $V_{NTAT}(T)$ value and its temperature slope ($TC_{V_{NTAT}}$) can be independently set via the resistors $R_2$ and $R_3$. As indicated by Equation (1), the sensed-temperature voltage $V_{NTAT}(T)$ decreases with increasing temperature, and vice versa.

Although the disclosure has been described in the context of the temperature sensor being an NTAT sensor, in alternative embodiments, other suitable types of temperature sensors may be used, such as a PTAT sensor with or without subsequent ADC stage and digital processing. Furthermore, in some alternative embodiments, two different temperature sensors are implemented: one to stabilize the frequency source 120 and another to determine the LUT-entry for the frequency divider 132.

Frequency Source

Figure 3:
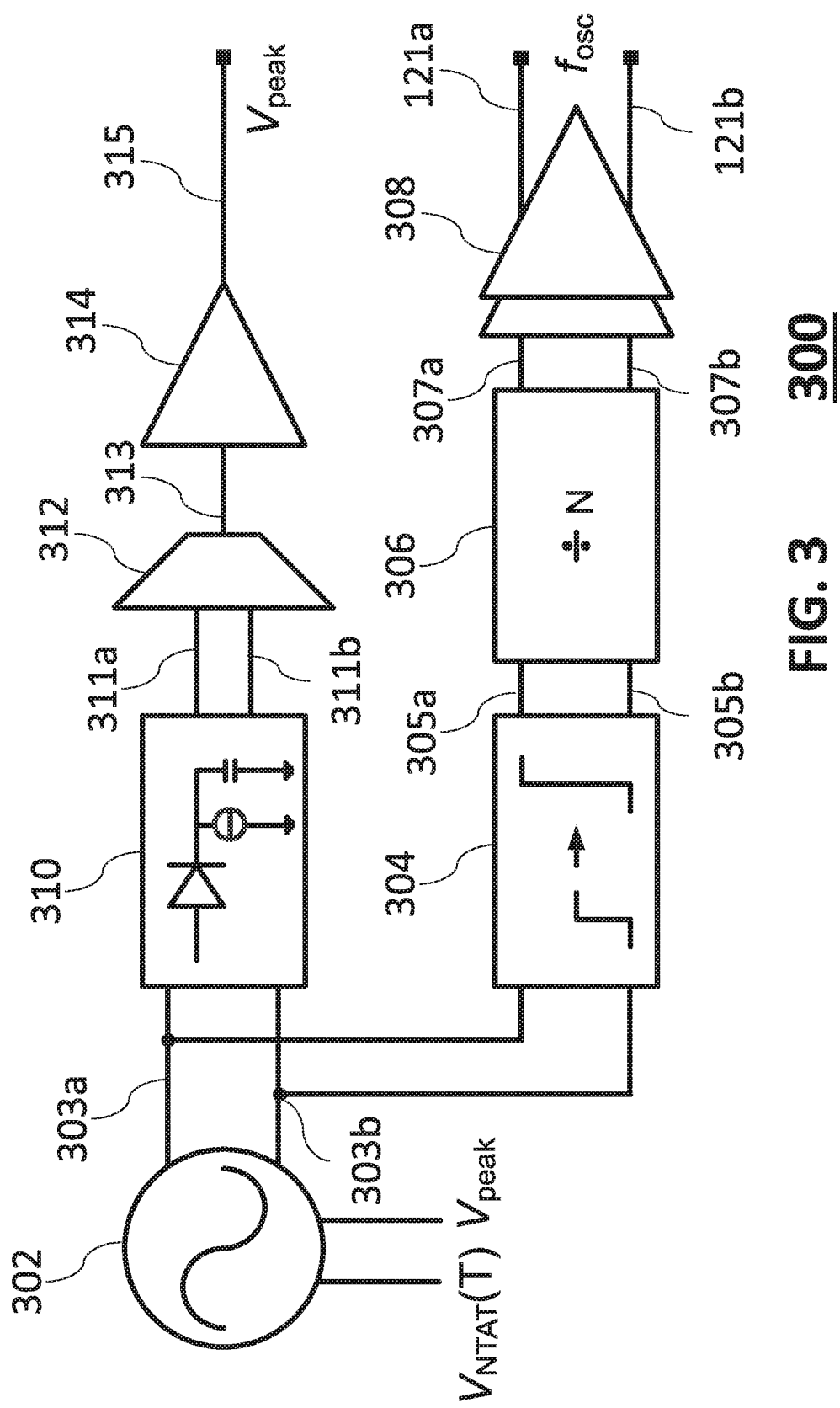
FIG. 3 is a block diagram of a frequency source that can be used to implement the frequency source 120 of FIG. 1, according to certain embodiments of the disclosure.

FIG. 3 is a block diagram of a frequency source 300 that can be used to implement the frequency source 120 of FIG. 1, according to certain embodiments of the disclosure. As shown in FIG. 3, an LC oscillator 302 generates an oscillating, differential, LC signal 303a/b. An RF level shifter 304 shifts the RF level of the LC signal 303a/b to generate an oscillating, differential, level-shifted signal 305a/b, which is frequency divided by a frequency pre-divider 306 to generate an oscillating, differential, frequency-divided signal 307a/b, which is buffered by a clock buffer 308 to generate the oscillator signal 121a/b of FIG. 1. A peak detector 310 generates a differential peak-detection signal 311a/b, which is based on the peak AC voltage level in the LC signal 303a/b. A differential-to-single-ended converter 312 converts the differential peak-detection signal 311a/b into a single-ended peak-detection signal 313, which is buffered by a signal buffer 314 to generate a peak voltage 315 whose voltage level $V_{peak}$ is representative of the peak AC voltage level in the LC signal 303a/b. The peak voltage 315 is fed back and applied, along with the sensed-temperature voltage $V_{NTAT}(T)$, to the LC core oscillator 302, which generates the LC signal 303a/b based on $V_{peak}$.

LC Oscillator

Figure 4:
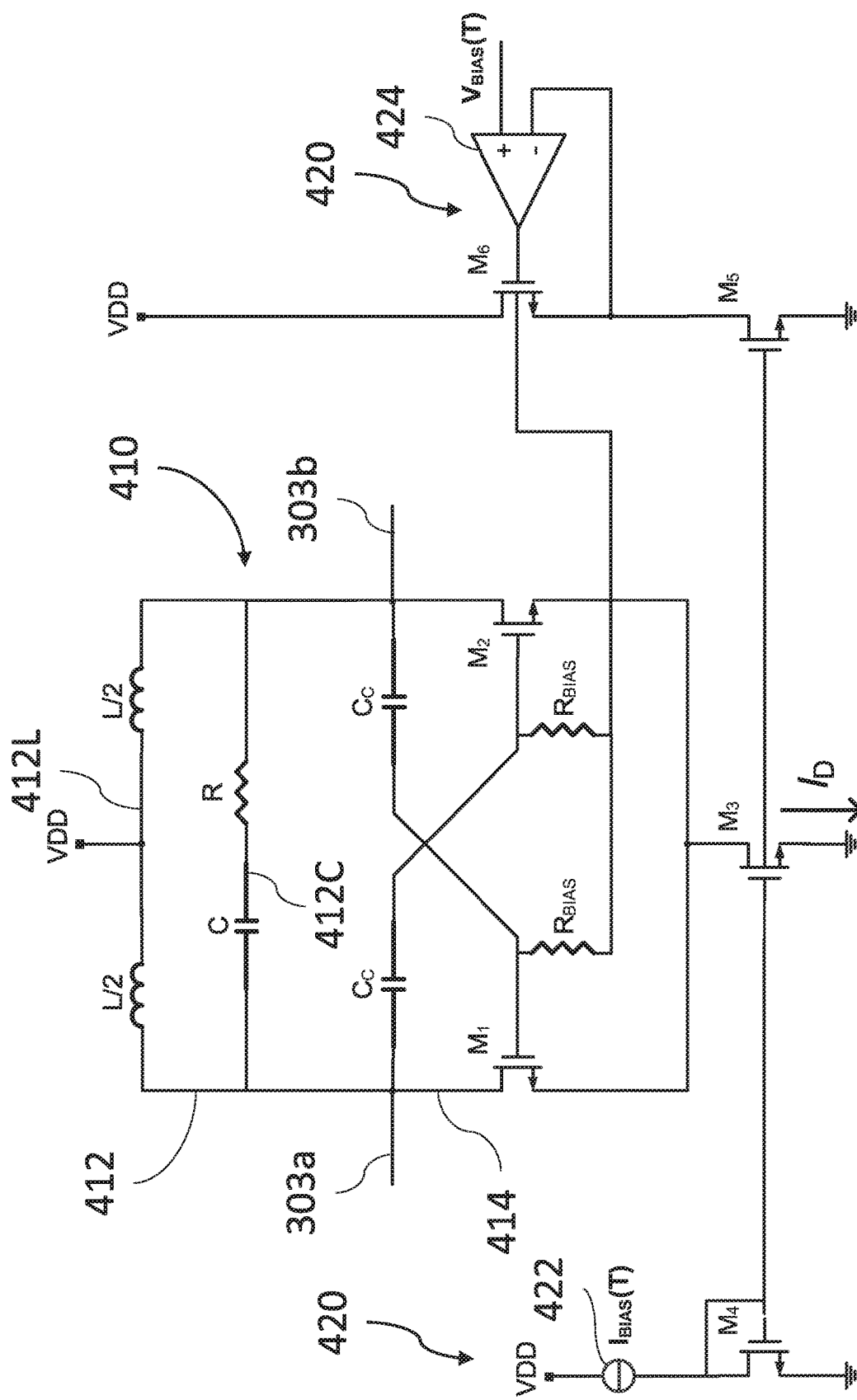
FIG. 4 is a schematic circuit diagram of an LC oscillator that can be used to implement the LC oscillator 302 of FIG. 3, according to certain embodiments of the disclosure.

FIG. 4 is a schematic circuit diagram of an LC oscillator 400 that can be used to implement the LC oscillator 302 of FIG. 3, according to certain embodiments of the disclosure. As shown in FIG. 4, the oscillator circuitry 400 has an LC core 410 and bias circuitry 420 that controls the operation of the LC core 410 based on a temperature-dependent bias current $I_{BIAS}(T)$ and a temperature-dependent bias voltage $V_{BIAS}(T)$. The LC core 410 comprises an LC tank 412 and a cross-coupled tank driver 414 that drives the LC tank 412 to oscillate and generate the LC signal 303a/b of FIG. 3.

As shown in FIG. 4, the LC tank 412 comprises (i) an inductor leg 412L, consisting of an inductor L having an inductance level L and an implicit (i.e., inherent) resistance level $R_L$ connected in parallel to (ii) a capacitor leg 412C consisting of (1) a capacitor C having a capacitance level C and an implicit resistance level $R_C$ and (2) an explicit resistor R having a resistance level $R_R$, where the resistance level $R_R$ of the explicit resistor R is selected such that the total resistance level $R_M$ of the capacitor leg 412C (i.e., $R_C+R_R$) is substantially equal to the total resistance level $R_L$ of the inductor leg 412L. If the resistances of the matched-resistance LC tank 412 of FIG. 4 are made with one or more backend metal layers, then at least a resistance match of 5% between $R_M$ and $R_L$ can be achieved. Note that, in FIG. 4, the power supply voltage VDD is applied to the center of the inductor L such that half of the inductor L is on the left of the VDD tap and the other half is on the right as depicted in the view of FIG. 4.

The LC tank of a typical, prior-art LC oscillator has (i) an inductor leg consisting of an inductor having an inductance level L and an implicit resistance level $R_L$ connected in parallel to (ii) a capacitor leg consisting of only a capacitor having a capacitance level C and an implicit resistance level $R_C$ and no explicit resistor, where $R_L \gg R_C$. The resonant frequency f of such a prior-art LC oscillator is given by Equation (2) as follows:

$$f = f_o \sqrt{\frac{L - CR_L^2}{L - CR_C^2}} \approx f_o \sqrt{1 - \frac{CR_L^2}{L}}, \qquad (2)$$

where:

$$f_o = \frac{1}{2\pi\sqrt{LC}}. \qquad (3)$$

The frequency temperature coefficient $TC_f$ is given by the following Equation (4):

$$TC_f = -0.5(TC_L + TC_C) - \frac{1}{Q_L^2}TC_{R_L} \qquad (4)$$

In a typical implementation, the implicit resistance level $R_L$ of the inductor can vary significantly with temperature, resulting in undesirable variations in the resonant frequency f of the prior-art LC oscillator over its operation temperature range. In addition, the $TC_{R_L}/Q_L^2$ term is sensitive to process variations, which makes it a formidable task to achieve a high accuracy frequency reference using batch calibration, if not completely impossible.

The resonant frequency f of the matched-resistance LC tank 412 of FIG. 4 is given by Equation (5) as follows:

$$f = f_o \sqrt{\frac{L - CR_L^2}{L - C(R_C + R_R)^2}}. \qquad (5)$$

In order to reduce the temperature dependency of the frequency reference generator 100 of FIG. 1, as described above, according to certain embodiments of the present disclosure, the resistance level $R_R$ of the explicit resistor R in the capacitor leg 412C of the LC oscillator 400 of FIG. 4 is selected such that $R_L \approx (R_C+R_R)$. In that case, as long as the temperature dependencies of the various resistances are substantially equivalent and assuming that the inductance L and the capacitance C are substantially temperature independent, the resonant frequency f of the LC oscillator 400 will be substantially constant over the operating temperature range and substantially equal to $f_o$.

The resulting frequency temperature coefficient $TC_f$ is ideally reduced to the following Equation (6):

$$TC_f \approx -0.5(TC_L + TC_C) \qquad (6)$$

where the $TC_L$ and $TC_C$ are more process-stable and predictable than the eliminated $TC_{R_L}/Q_L^2$ term in Equation (4) above.

In practice, a small resistance mismatch (ε) is expected over process variations, such that $R_M=R_L(1+\varepsilon)$. In that case, the frequency f and the $TC_f$ are adjusted as follows:

$$f = f_o\left(1 + \frac{\varepsilon}{Q_L^2}\right) \quad (7)$$

$$TC_f \approx -0.5(TC_L + TC_C) - \frac{2\varepsilon}{Q_L^2} TC_{R_L} \quad (8)$$

Compared to a typical, prior-art LC tank, the $TC_{R_L}$ contribution of the matched-resistance LC tank 412 of FIG. 4 reduces by a factor of 2ε. That is a 10× reduction for a relaxed resistance mismatch of 5%. A resistance mismatch of 5% can be achieved over 2-3 GHz and from −50° C. to 150° C. In fact, 2% resistance mismatch can be achievable at a frequency around 2.5 GHz. With ideal resistance matching, the process-sensitive $TC_{R_L}$ contribution can be fully eliminated, which leads to a process-insensitive frequency temperature coefficient $TC_f$. Even with 5% resistance mismatch, the $TC_{R_L}$ contribution reduces by 10-fold, e.g., to only 3 ppm/°C., when $Q_L=10$ and $TC_{R_L}=3000$ ppm/°C. This makes the resulting $TC_f$ much less process-sensitive, and paves the way for an on-chip LC-based frequency reference achieving better than ±0.1% (or 1000 ppm) inaccuracy over an Automotive Grade-0 temperature range of −50° C. to 150° C.

In certain implementations of the disclosure, the LC tank 412 of FIG. 4 is passive and non-trimmable. As used herein, the term "passive, non-trimmable" implies that the corresponding component (e.g., a capacitor, inductor, or resistor) has characteristic features (e.g., capacitance, inductance, and/or resistance) that cannot be actively controlled either with a one-time factory trim or by on-line compensation in the field. Note that those characteristic features may, however, inherently vary with process, voltage, temperature, and lifetime.

As shown in FIG. 4, the tank driver 414 is a transconductance stage having two N-type (e.g., MOS) transistor-based driving devices $M_1$ and $M_2$, cross-coupled by coupling capacitors Cc and connected to an N-type transistor-based current sink $M_3$.

The bias circuitry 420 provides oscillation amplitude control and optimal biasing of parasitic capacitors associated with active circuitry. In particular, the bias circuitry 420 includes an N-type transistor-based current mirror $M_4$ that mirrors a temperature-dependent bias current $I_{BIAS}(T)$ from a current source 422 into the current sink $M_3$ and also into another N-type transistor-based replica current sink $M_5$ of the bias circuitry 420. The replica current sink $M_5$ is connected to another N-type transistor-based device $M_6$ that is controlled by a temperature-dependent bias voltage $V_{BIAS}(T)$ applied to an op-amp 424. Note that the gate voltage of the transistor $M_6$ is also applied to two bias resistors $R_{BIAS}$. In certain implementations, the bias voltage $V_{BIAS}(T)$ is the sensed-temperature voltage $V_{NTAT}(T)$ of FIGS. 1 and 2, and the bias current $I_{BIAS}(T)$ is generated based on the peak voltage $V_{peak}$ of FIG. 3. In certain alternative implementations, the amplitude control loop is closed off-chip.

Figure 5:
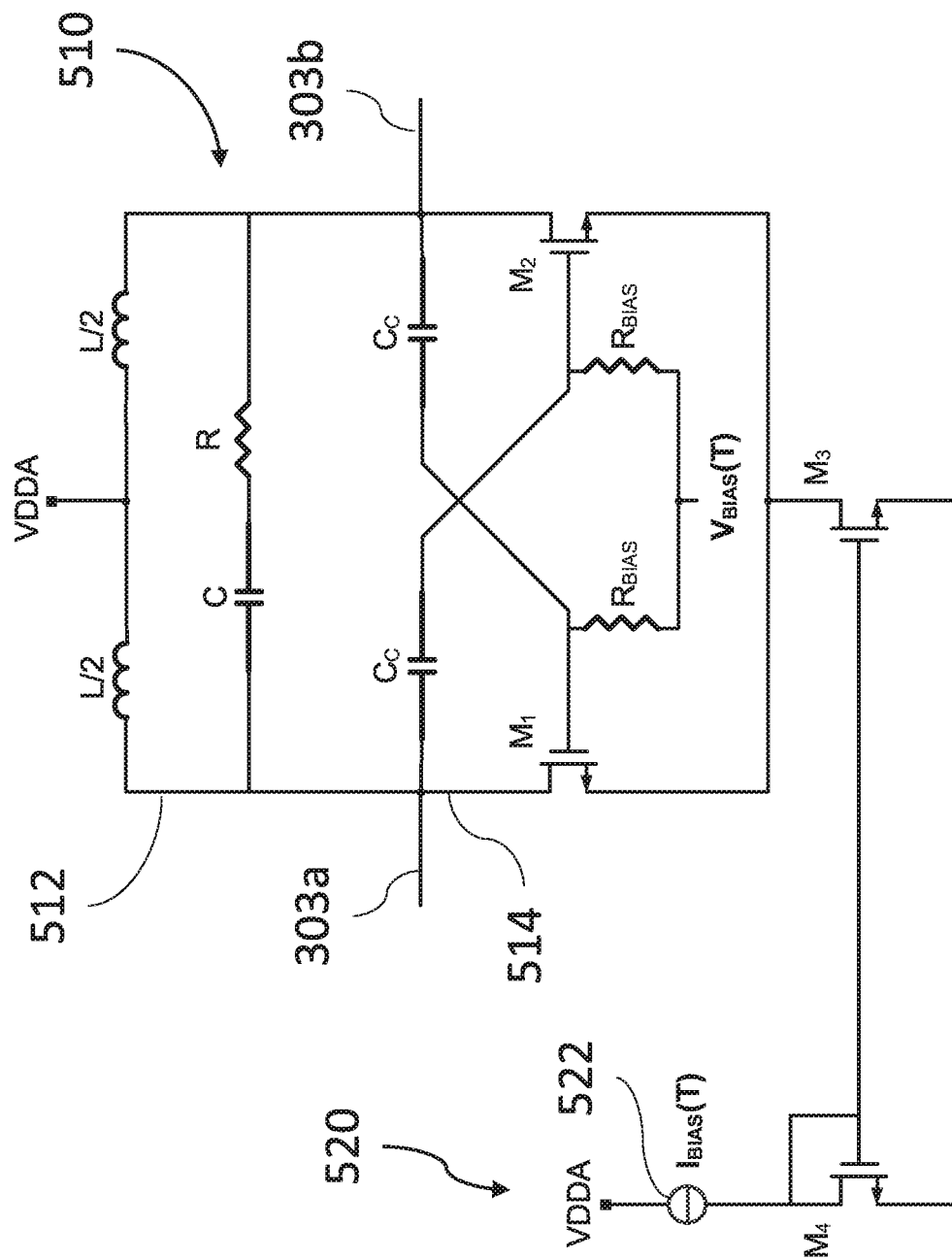
FIG. 5 is a schematic circuit diagram of an LC oscillator that can be used to implement the LC oscillator 302 of FIG. 3, according to certain other embodiments of the disclosure.

FIG. 5 is a schematic circuit diagram of an LC oscillator 500 that can be used to implement the LC oscillator 302 of FIG. 3, according to certain other embodiments of the disclosure. The elements of the LC oscillator 500 are analogous to the analogously labeled elements of the LC oscillator 400 of FIG. 4, except that (i) the bias voltage $V_{BIAS}(T)$ is applied directly to the two bias resistors $R_{BIAS}$ for optimal gate biasing and (ii) op-amp 424 and devices $M_5$ and $M_6$ of FIG. 4 are omitted.

Figure 6:
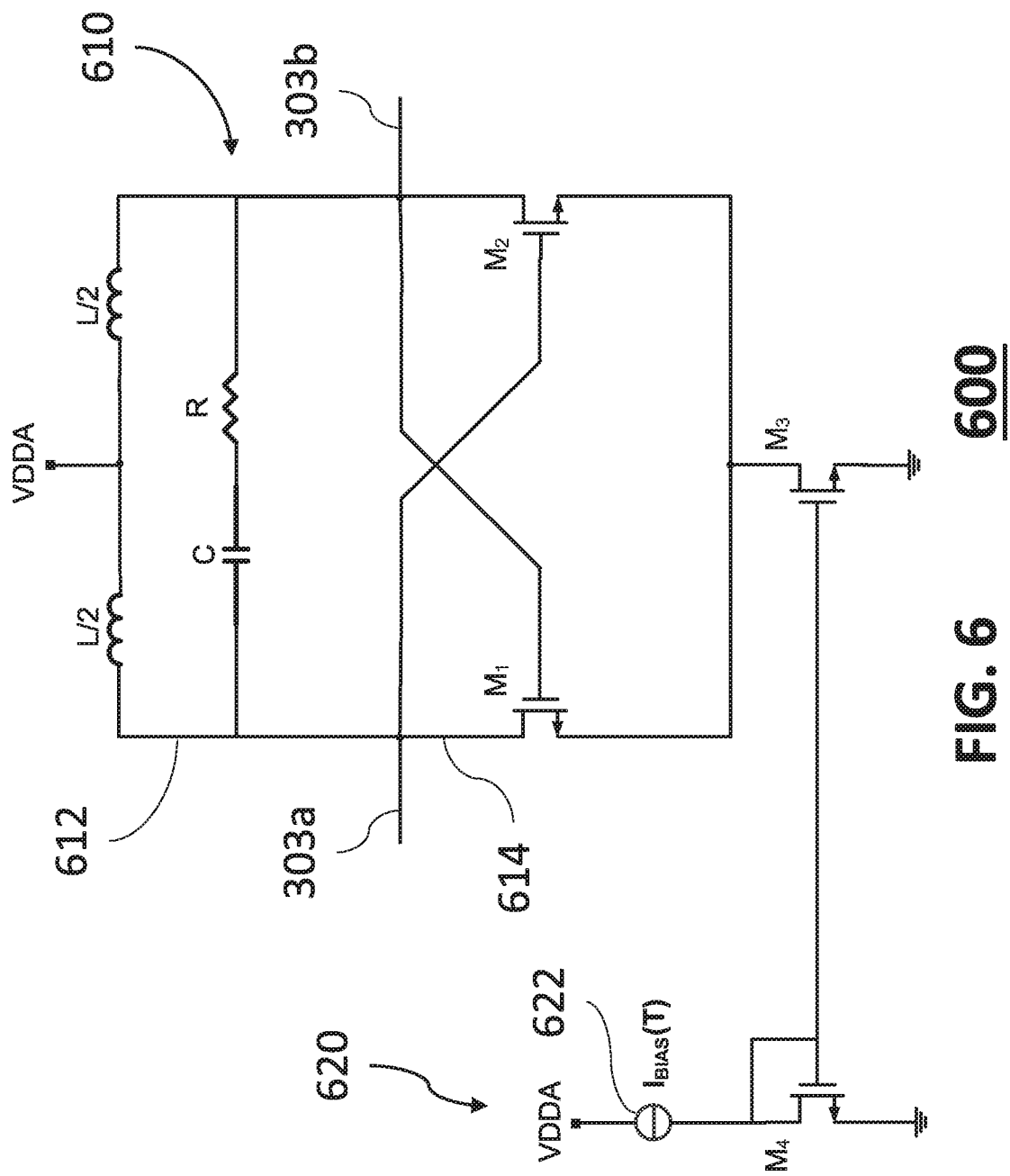
FIG. 6 is a schematic circuit diagram of an LC oscillator that can be used to implement the LC oscillator 302 of FIG. 3, according to certain still other embodiments of the disclosure.

FIG. 6 is a schematic circuit diagram of an LC oscillator 600 that can be used to implement the LC oscillator 302 of FIG. 3, according to certain still other embodiments of the disclosure. The elements of the LC oscillator 600 are analogous to the analogously labeled elements of the LC oscillator 500 of FIG. 5, except that (i) the two bias resistors $R_{BIAS}$ and the two cross-coupling capacitors Cc are omitted and (ii) no bias voltage $V_{BIAS}(T)$ is applied.

The choice of which secondary temperature-compensation circuitry to use may depend on which error source is dominant. For example, if the temperature coefficient or the voltage dependency of parasitic capacitors is dominant, then the bias circuitry of FIG. 4 or 5 is used. If the frequency deviation due to oscillation harmonics is dominant, then the bias circuitry of FIG. 4, 5, or 6 is used. In addition, the choice of NTAT or PTAT to implement $I_{BIAS}(T)$ or $V_{BIAS}(T)$ depends on the temperature coefficients of the cross-coupled transistors.

Current Source

Figure 7:
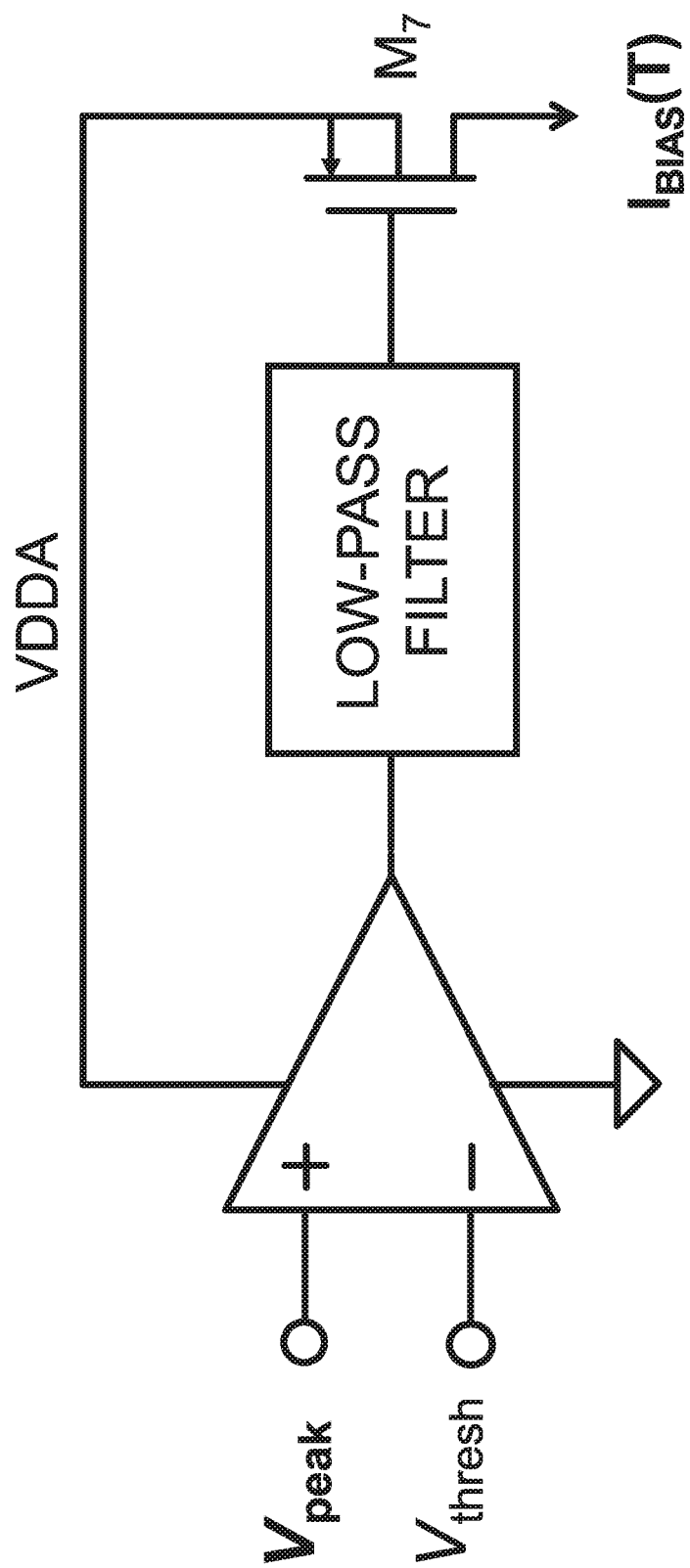
FIG. 7 is a schematic circuit diagram of a current source 700 that can be used to implement the current sources 422, 522, and 622 of FIGS. 4-6, according to certain embodiments of the disclosure.

FIG. 7 is a schematic circuit diagram of a current source 700 that can be used to implement the current sources 422, 522, and 622 of FIGS. 4, 5, and 6, according to certain embodiments of the disclosure. When the peak detector output $V_{peak}$ increases above the specified threshold voltage ($V_{thresh}$), the differential input is amplified, low-pass filtered, and applied to the gate of the PMOS current source $M_7$. As a result, the gate-to-source voltage $V_{GS}$ of $M_7$ decreases, and hence the bias current $I_{BIAS}(T)$ and the peak voltage $V_{peak}$ will drop. When $V_{peak}<V_{thresh}$, the $V_{GS}$ of $M_7$ increases, and hence $I_{BIAS}(T)$ and the $V_{peak}$ will rise. Therefore, during the steady-state operation, $V_{peak}$ is regulated to the specified $V_{thresh}$.

Level Shifter

Figure 8:
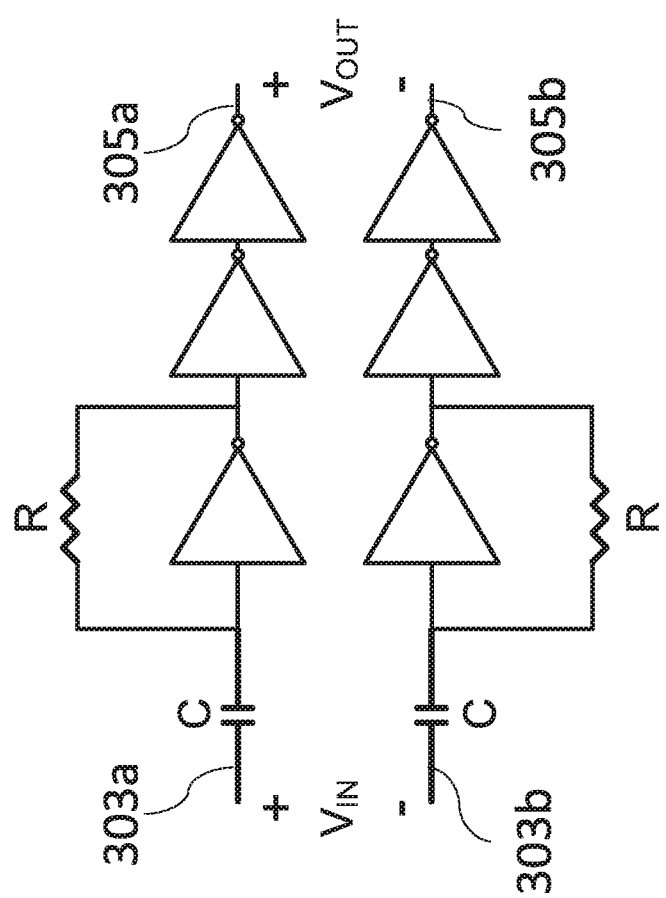
FIG. 8 is a schematic circuit diagram of a level shifter that can be used to implement the level shifter 304 of FIG. 3, according to certain embodiments of the disclosure.

FIG. 8 is a schematic circuit diagram of a level shifter 800 that can be used to implement the level shifter 304 of FIG. 3, according to certain embodiments of the disclosure. The differential-input signals 303a/303b of the level shifter (i.e., ideally sinusoidal) are ac-coupled to a well-biased first inverter stage, and further buffered by subsequent inverter stages to generate rail-to-rail outputs 305a/305b.

Frequency Pre-Divider

Figure 9:
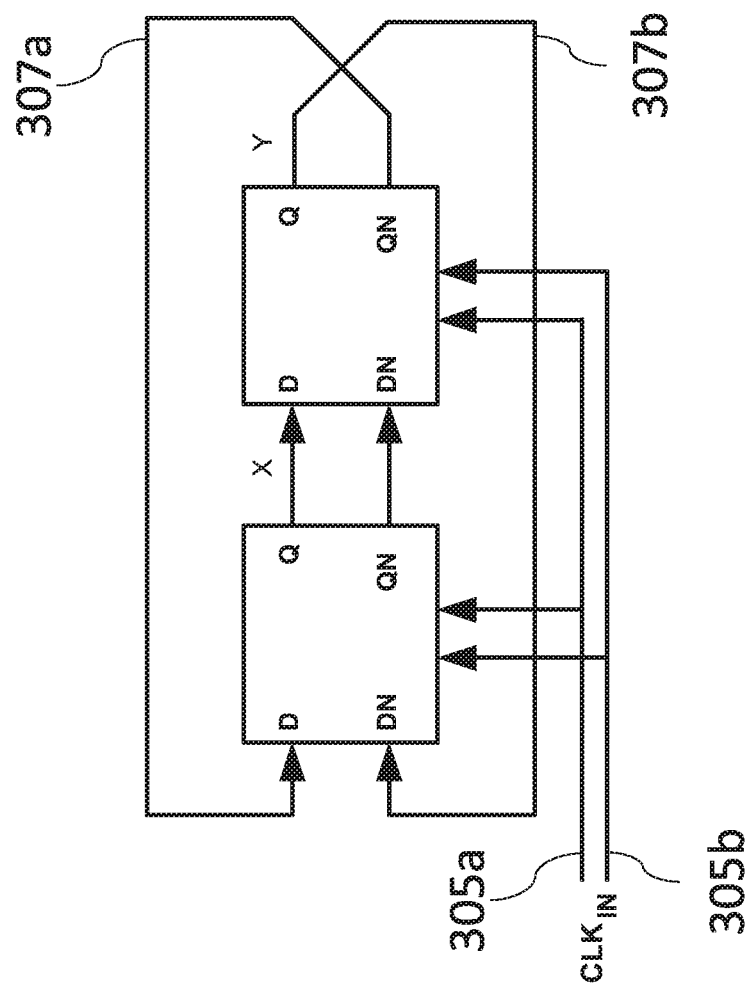
FIG. 9 is a schematic circuit diagram of a frequency divider that can be used to implement the frequency pre-divider 306 of FIG. 3, according to certain embodiments of the disclosure.

FIG. 9 is a schematic circuit diagram of a frequency divider 900 that can be used to implement the frequency pre-divider 306 of FIG. 3 for a divisor value N=2, according to certain embodiments of the disclosure. A divisor value of $N=2^k$, where k is a positive integer greater than one, can be achieved by cascading a suitable number of additional flip-flop stages. Note that the frequency pre-divider 306 can be optional, depending on the LC resonant frequency and the speed of the technology used to process the signals.

Clock Buffers

The clock buffer 308 of FIG. 3 can be implemented using a series of inverters.

Peak Detector

Figure 10:
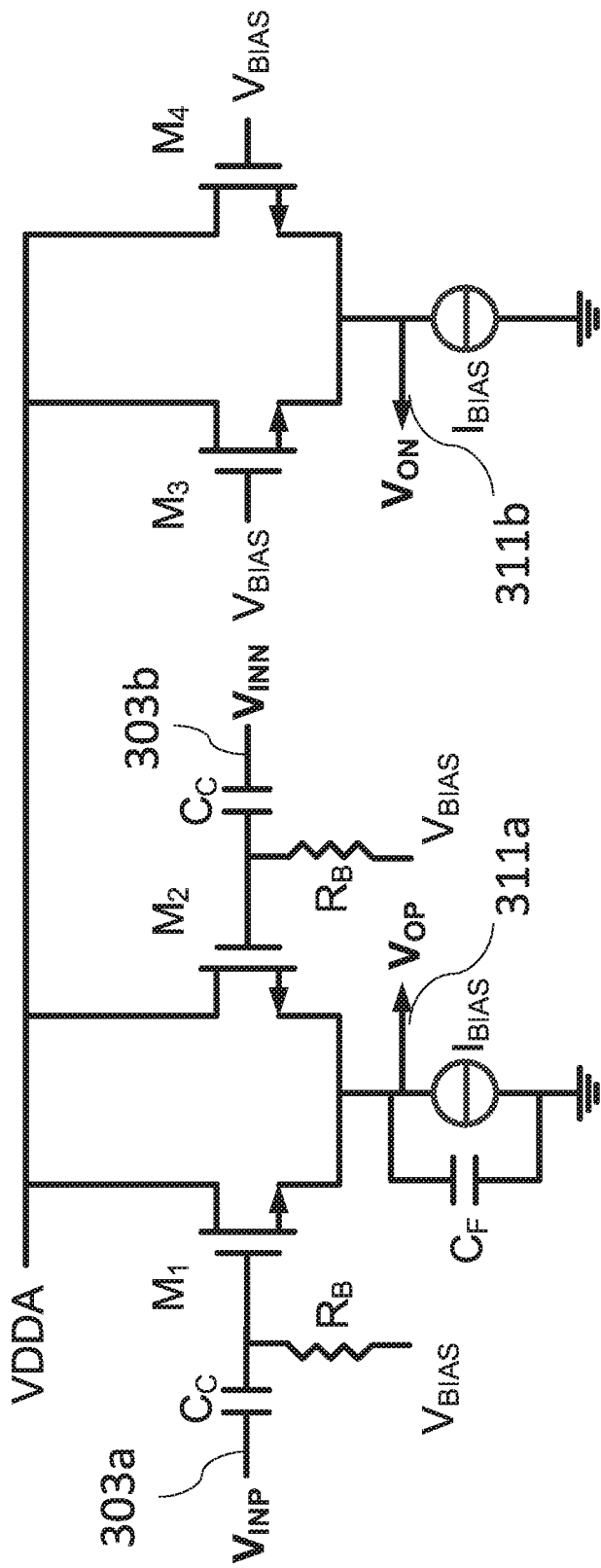
FIG. 10 is a schematic circuit diagram of a peak detector that can be used to implement the peak detector 310 of FIG. 3, according to certain embodiments of the disclosure.

FIG. 10 is a schematic circuit diagram of a peak detector 1000 with common-mode input rejection that can be used to implement the peak detector 310 of FIG. 3, according to certain embodiments of the disclosure. During the half cycle when the LC signal component 303a from the LC oscillator 302 of FIG. 3 is positive (and the LC signal component 303b is negative), the n-type transistor-based device $M_1$ is on, while $M_2$ is off, operating as a source follower that charges the capacitor $C_F$, and hence the peak-detector output 311a/b tracks the peak of the LC signal 303a with a linear (or first-order) attenuation factor within a specified input voltage amplitude range. During the other half cycle when the LC signal component 303b is positive (and the LC signal component 303a is negative), $M_2$ is on, while $M_1$ is off, operating as a source follower that charges the capacitor $C_F$, and hence the peak-detector output 311a/b tracks the peak of the LC signal 303b. The peak detector 1000 has a replica stage comprising equivalent n-type transistor-based devices $M_3$ and $M_4$. The replica devices $M_3$ and $M_4$ and their DC voltages track $M_1$ and $M_2$ and their DC voltages over PVT-variation. Note that (i) the devices $M_1$, $M_2$, $M_3$, and $M_4$ work in weak inversion and (ii) the capacitance of $C_F$ and the transconductances of $M_1$ and $M_2$ should be properly chosen such that the output ripple is reasonably small. In some alternative embodiments, extra subsequent $R_C$ filtering may be implemented for even smaller ripple.

Differential-to-Single-Ended Converter

Figure 11:
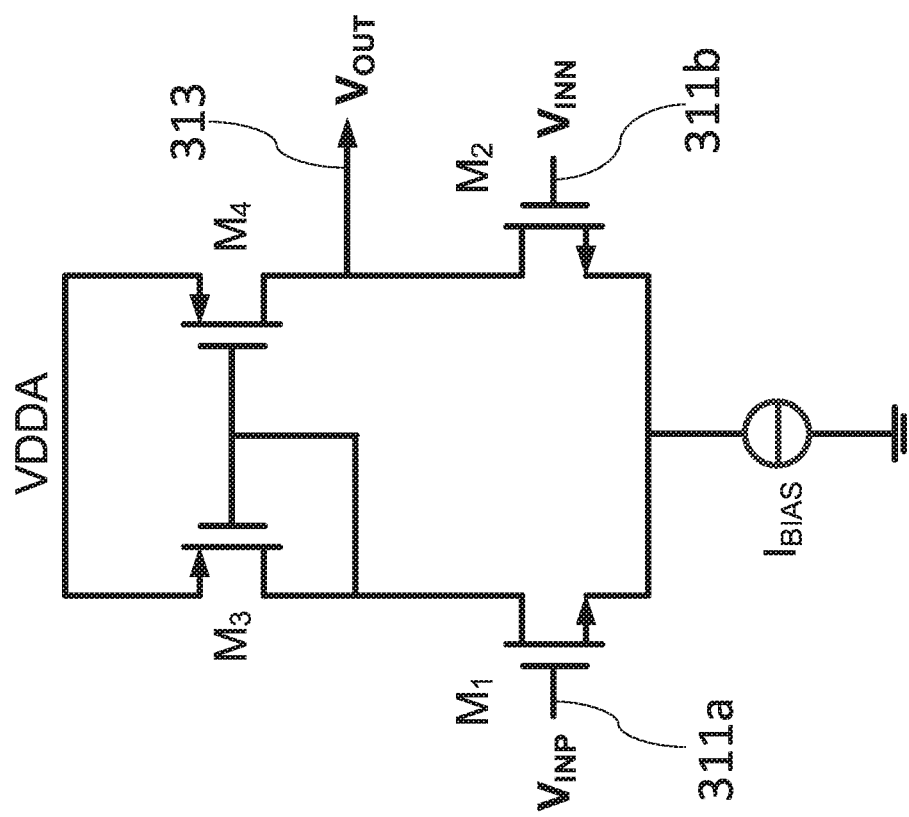
FIG. 11 is a schematic circuit diagram of a differential-to-single-ended converter that can be used to implement the differential-to-single-ended converter 312 of FIG. 3, according to certain embodiments of the disclosure.

FIG. 11 is a schematic circuit diagram of a differential-to-single-ended converter 1100 that can be used to implement the differential-to-single-ended converter 312 of FIG. 3, according to certain embodiments of the disclosure. The differential voltage inputs 311a/311b are applied to the inputs of an N-type MOS differential pair $M_1$ and $M_2$ and are converted to the single-ended signal 313 via a P-type MOS current mirror $M_3$ and $M_4$.

DC Buffer

Figure 12:
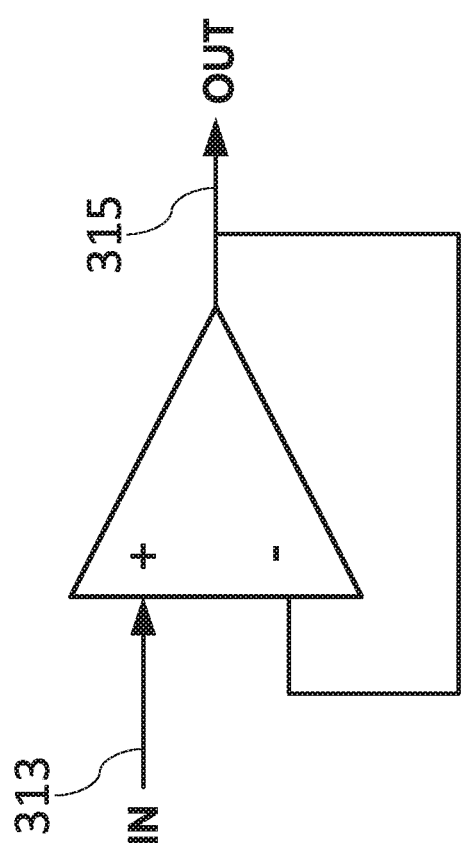
FIG. 12 is a schematic circuit diagram of a buffer that can be used to implement the DC buffer 314 of FIG. 3, according to certain embodiments of the disclosure.

FIG. 12 is a schematic circuit diagram of a buffer 1200 that can be used to implement the signal buffer 314 of FIG. 3 for the single-ended peak-detection signal 313, according to certain embodiments of the disclosure. The illustrated buffer (e.g., with unit gain) includes an op-amp, where the output 315 of the op-amp is fed back to the negative input terminal.

Frequency Divider

Figure 13:
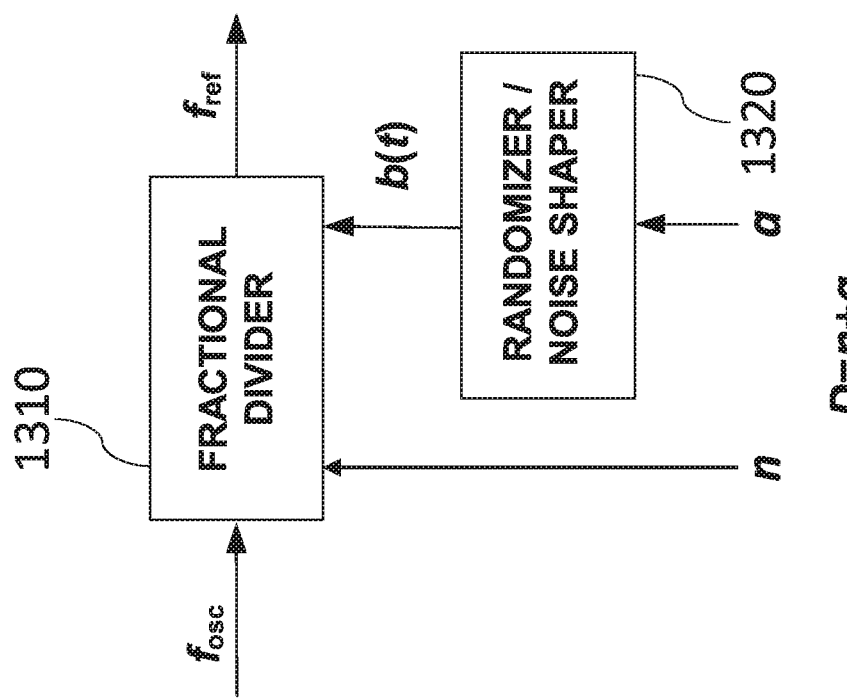
FIG. 13 is a schematic circuit diagram of a frequency divider that can be used to implement the frequency divider 132 of FIG. 1, according to certain embodiments of the disclosure.

FIG. 13 is a schematic circuit diagram of a frequency divider 1300 that can be used to implement the frequency divider 132 of FIG. 1, according to certain embodiments of the disclosure. Frequency divider 1300 comprises a fractional frequency divider 1310 and a randomizer/noise shaper 1320. A fractional frequency divider is a component that divides the frequency of an incoming signal by a fractional divisor value D on average over time. In general, for the frequency divider 1300 of FIG. 13, the divisor value D is a positive number having an integer portion n and a fractional portion a. One type of fractional frequency divider is a dual-modulus frequency divider, which divides the frequency of an incoming signal by the integer value n for a certain fraction of the time and by the next larger integer value (n+1) for the rest of the time, where the fractional value a determines the fraction of time that the dual-modulus frequency divider divides the frequency $f_{osc}$ of the incoming signal by (n+1). For example, using a dual-modulus frequency divider for the fractional frequency divider 1310, if the divisor value D is 3.2, then n=3 and a=0.2, where the dual-modulus frequency divider 1310 will frequency divide the incoming signal by (n+1=4) for 20 percent of the time and by (n=3) for 80 percent of the time.

The randomizer/noise shaper 1320 determines specific, randomized, short time periods b(t) for the fractional frequency divider 1310 to frequency divide the incoming signal by different integer divisor values (e.g., n−1, n, and n+1) such that the time-average divisor value will be the fractional divisor value D, where the resultant noise spectrum is engineered by the noise shaper to shift the majority of the energy to larger frequency offsets with respect to the resulting reference frequency $f_{ref}$. In this way, the frequency divider 1300 performs fractional spur suppression. In certain implementations, the fractional frequency divider 1310 divides the frequency of the incoming signal by n+b(t), where b(t) is 0, when the frequency is to be divided by n and b(t) is 1, when the frequency is to be divided by n+1. In some applications, the frequency should be higher-order noise shaped, where the noise-shaper order and topology determine the number of different integer divisor values needed.

Those skilled in the art will understand that there are other suitable techniques for implementing the frequency-adjustment circuitry 130 of FIG. 1, including, without limitation, multi-modulus and other types of frequency division and frequency counting. In the case of a frequency counting, a look-up table that maps different operating temperatures to corresponding counter threshold values would be employed instead of the LUT of FIG. 1. At least one frequency counter that can be used in alternative embodiments of this disclosure is the comparison circuit 131 described in U.S. patent application publication no. 2019/0028106 A1, the teachings of which are incorporated herein by reference in their entirety.

LC Tank

Figure 14:
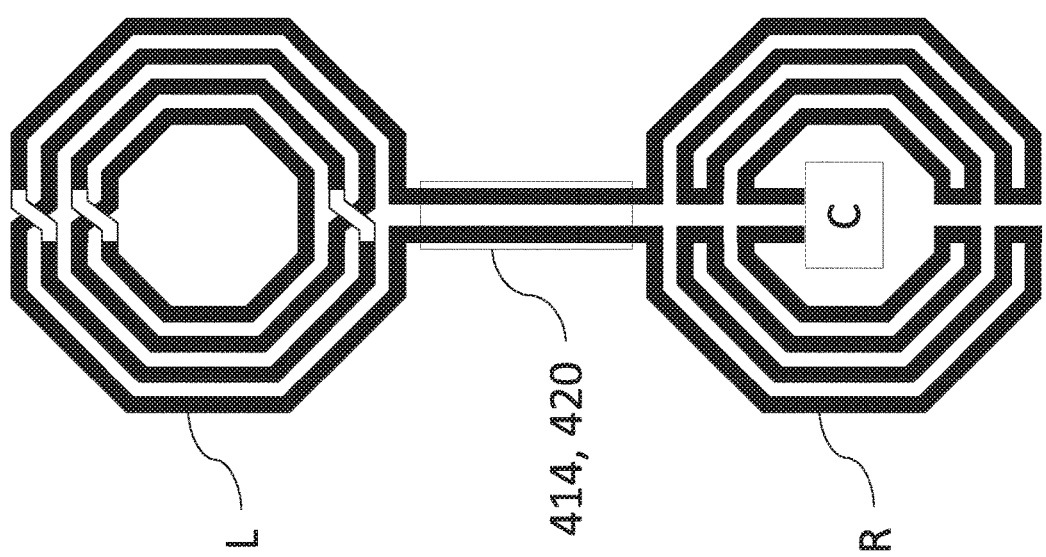
FIG. 14 is a top-down view of the layout of an LC tank that can be used to implement the matched-resistance LC tank 412 of FIG. 4, according to certain embodiments of the disclosure.

FIG. 14 is a top-down view of the layout of an LC tank 1400 that can be used to implement the matched-resistance LC tank 412 of FIG. 4, according to certain embodiments of the disclosure. FIG. 14 shows the metal traces in a metal layer of a multi-layer integrated circuit used to form the inductor L and the resistor R of the LC tank 412. Note that the inductor L includes three cross-over regions (indicated in white) in which one metal trace crosses over another metal trace in a different metal layer using vias to avoid physical contact (and therefore electrical shorting) between the two metal traces. The capacitor C of the LC tank 412 is represented symbolically in FIG. 14 and may be implemented using any suitable structure such as (without limitation) the parallel fingers of a fringe capacitor connected to the broken center tap of the resistor R in the (otherwise open) central region defined by the resistor layout. FIG. 14 also shows the location of the tank driver 414 and the bias circuitry 420 of the LC oscillator 400 of FIG. 4, which are implemented in one or more other layers of the integrated circuit and are connected to the LC tank 1400 using suitable vias (not shown).

To ensure good resistance matching over process spread, the process-tracking metal resistor R is implemented in the same thick backend metal layer as the inductor L. To minimize parasitic inductance associated with the metal resistor, metal windings are designed such that adjacent currents are 180° out of phase, while the inductor windings have in-phase adjacent currents to enhance magnetic couplings. Furthermore, to improve resistance matching at higher frequencies (e.g., beyond 2 GHz), the outer dimension (e.g., overall size) of the metal resistor layout may be deliberately designed somewhat larger than that of the inductor so that the DC resistance is higher than the inductor counterpart. This will compensate for different proximity effects due to different adjacent current directions at multi-GHz operating frequencies. To save area, the backend metal capacitor C may be placed beneath the metal resistor R without compromising the LC tank performance. Note that, for simplicity, the layout drawing does not include ground shields and metal tiles around the inductor L and/or the resistor R when applicable.

Figure 15:
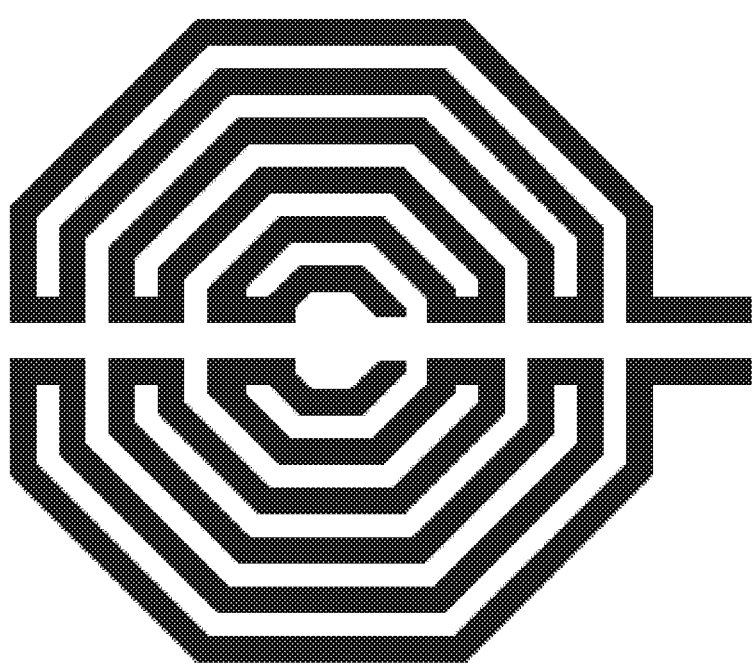
FIG. 15 is a top-down view of the layout of a resistor that can be used to implement the resistor R of the matched-resistance LC tank 412 of FIG. 4, according to certain embodiments of the disclosure.

FIG. 15 is a top-down view of the layout of a resistor 1500 that can be used to implement the resistor R of the matched-resistance LC tank 412 of FIG. 4, according to certain embodiments of the disclosure. The resistor 1500 has a smaller inner diameter than the resistor R of FIG. 14. Note that the capacitor C would be connected to the broken center tap of the resistor 1500 in the smaller central region defined by the resistor layout.

Figure 16:
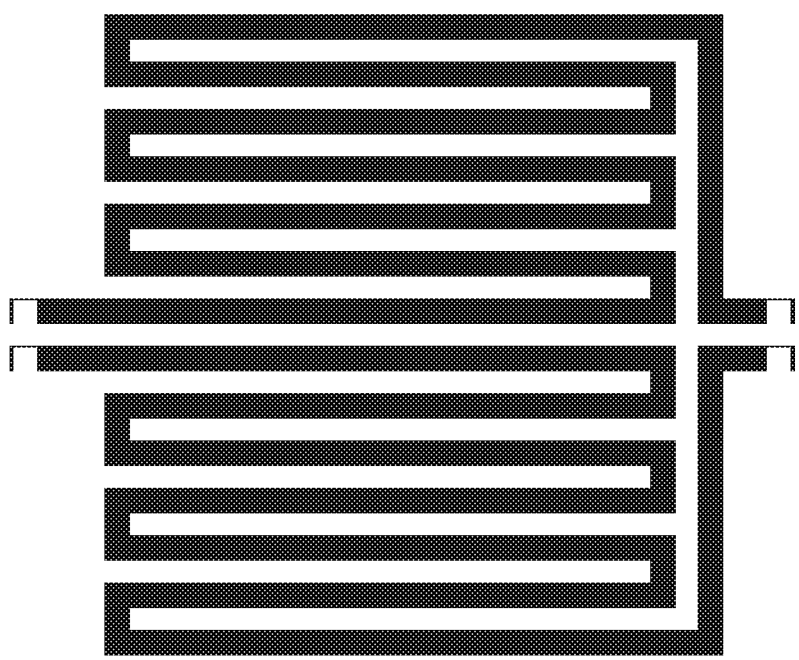
FIG. 16 is a top-down view of the layout of a modified meander resistor that can be used to implement the resistor R of the matched-resistance LC tank 412 of FIG. 4, according to certain embodiments of the disclosure.

FIG. 16 is a top-down view of the layout of a modified meander resistor 1600 having folded metal traces that form adjacent arms having currents flowing in opposite directions that can be used to implement the resistor R of the matched-resistance LC tank 412 of FIG. 4, according to certain embodiments of the disclosure. Note that the capacitor C would be connected to the broken bottom or top tap of the resistor 1600, depending on the implementation.

Figure 17B:
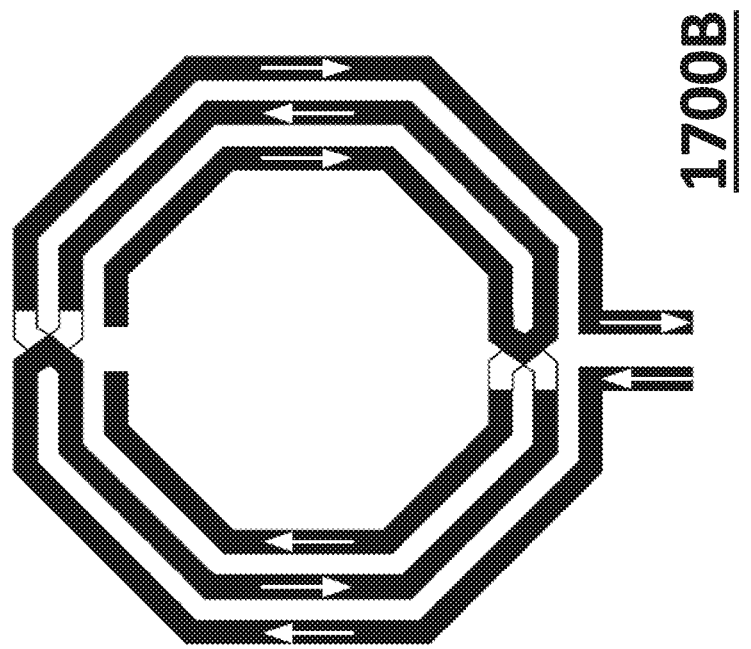
FIGS. 17A and 17B are top-down views of the layout of resistors that can be alternatively used to implement the resistor R of the matched-resistance LC tank 412 of FIG. 4, according to certain embodiments of the disclosure.
Figure 17A:
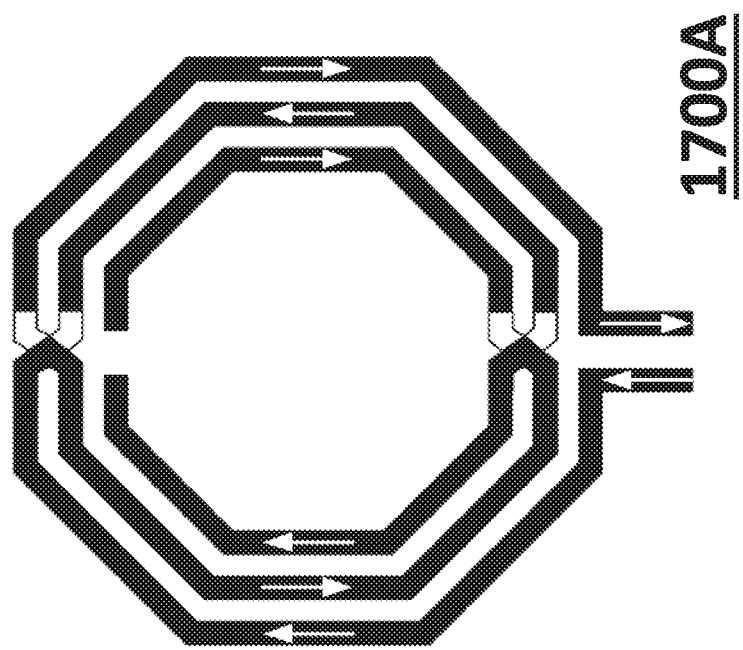

FIGS. 17A and 17B are top-down views of the layout of resistors 1700A and 1700B that can be alternatively used to implement the resistor R of the matched-resistance LC tank 412 of FIG. 4, according to certain embodiments of the disclosure. Both resistors 1700A and 1700B have cross-over regions to match the resistances of the cross-over regions in the corresponding inductor L (not shown). The resistor 1700A is an asymmetric version with the left half of the resistor implemented in a single metal layer and the right half implemented in two different metal layers with two cross-over regions, while the resistor 1700B is a symmetric version with each half implemented in two different metal layers with a single cross-over region. Note that the capacitor C would be connected to the broken center tap of the resistor 1700A/1700B in the central region defined by the resistor layout.

Figure 18C:
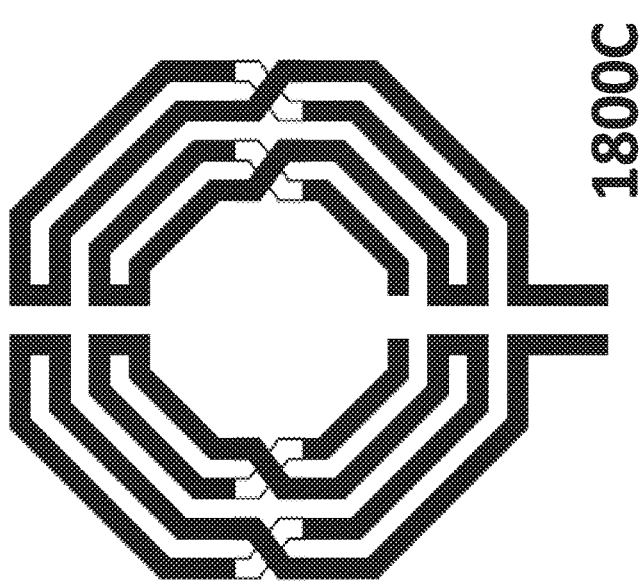
FIGS. 18A-18C are top-down views of the layout of resistors 1800A-1800C that can be alternatively used to implement the resistor R of the matched-resistance LC tank 412 of FIG. 4, according to certain embodiments of the disclosure.
Figure 18B:
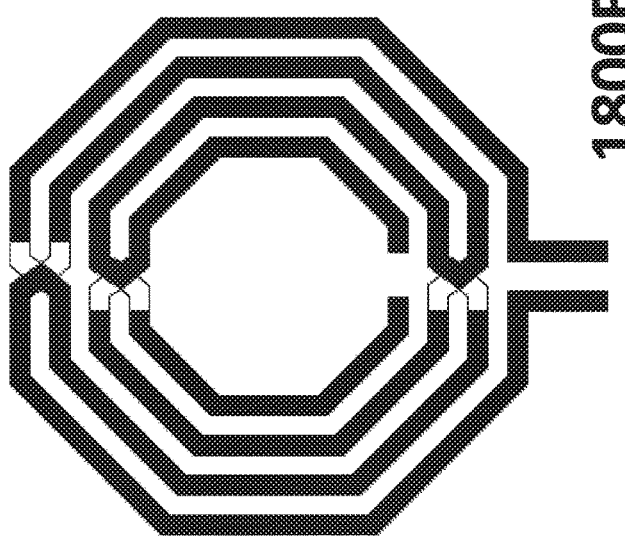
Figure 18A:
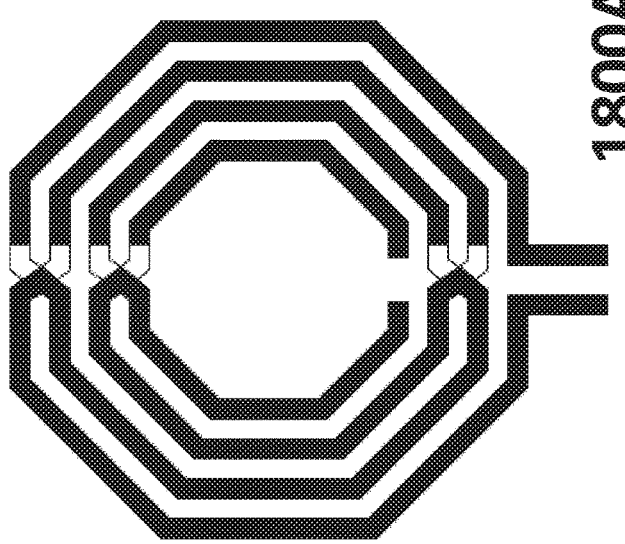

FIGS. 18A-18C are top-down views of the layout of resistors 1800A-1800C that can be alternatively used to implement the resistor R of the matched-resistance LC tank 412 of FIG. 4, according to certain embodiments of the disclosure. Resistors 1800A-1800C have cross-over regions to match the resistances of the cross-over regions in the corresponding inductor L (not shown). The resistors 1800A and 1800B are asymmetric versions with different numbers of cross-over regions in their left and right halves, while the resistor 1800C is a symmetric version with identical number of cross-over regions in its left and right halves. Note that the capacitor C would be connected to the broken center tap of the resistor 1800A/1800B/1800C in the central region defined by the resistor layout.

Figure 19A:
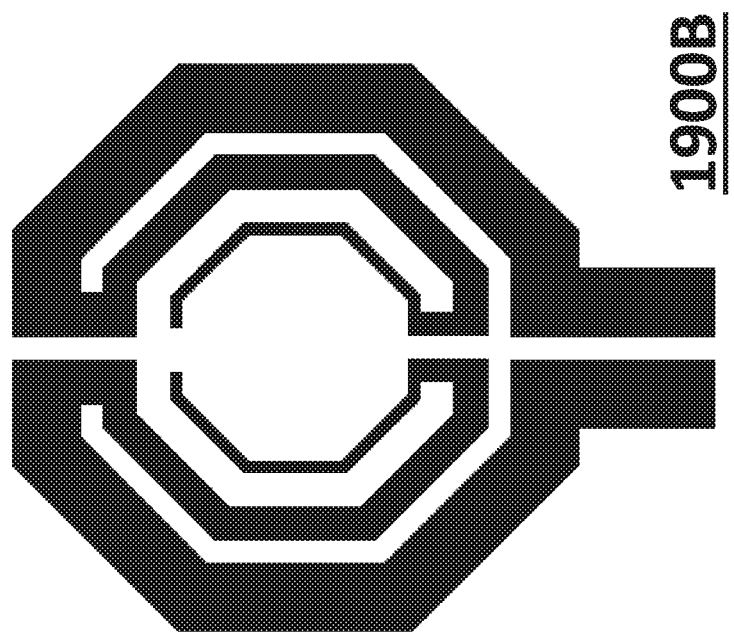
FIGS. 19A and 19B are top-down views of the layout of a tapered inductor and a tapered resistor that can be respectively used to implement the inductor L and the resistor R of the matched-resistance LC tank 412 of FIG. 4, according to certain embodiments of the disclosure.
Figure 19B:
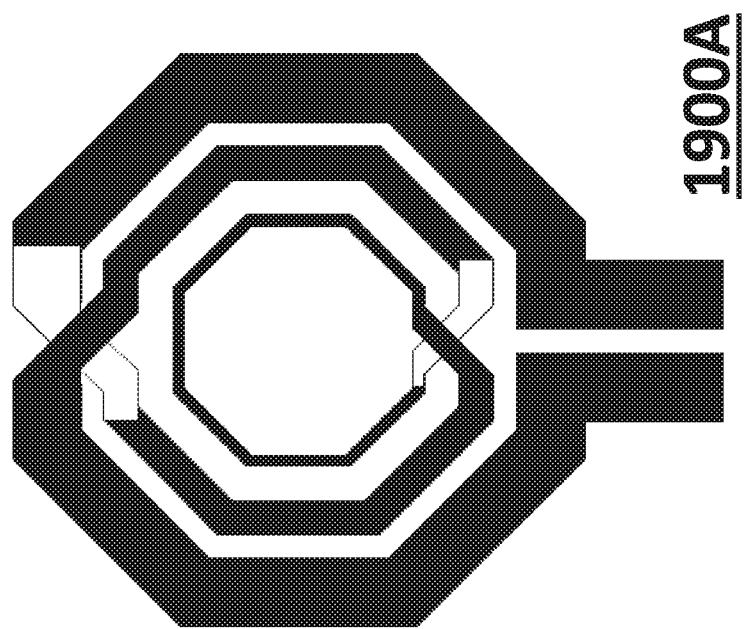

FIGS. 19A and 19B are top-down views of the layout of a tapered inductor 1900A and a tapered resistor 1900B that can be respectively used to implement the inductor L and the resistor R of the matched-resistance LC tank 412 of FIG. 4, according to certain embodiments of the disclosure. The trace widths and/or trace spacings of the inductor windings are tapered, where the innermost winding has the smallest trace width, the outermost winding has the largest trace width, and the rest of the windings vary in between. One advantage of such tapered inductors is reduced current crowding (or proximity) effects, and hence lower inductance temperature coefficient ($TC_L$) while maintaining, if not further improving, the relatively-high Q-factor. Note that the capacitor C would be connected to the broken center tap of the tapered resistor 1900B in the central region defined by the resistor layout.

As indicated in FIGS. 14-19B, the physical layout of the resistor R of the matched-resistance LC tank 412 of FIG. 4 is specifically designed such that the resistance $R_R$ of the resistor R (plus the substantially smaller resistance $R_C$ of the capacitor C) will be substantially equal to the resistance $R_L$ of the inductor L. This resistance matching can be achieved by implementing the resistor R and the inductor L with the same number of nested (i.e., concentric) loops of metal traces having similar physical characteristics (e.g., lengths, widths, thicknesses, and material compositions). Note that the term "loop" refers to a subset of metal traces that are located at a similar distance from the central region of the resistor/inductor, whether or not those metal traces are directly interconnected. Thus, the resistor R and the inductor L of FIG. 14 and the resistors 1800A/B/C of FIGS. 18A/B/C all have four nested loops, the resistor 1500 of FIG. 15 has six nested loops, and the resistors 1700A/B of FIGS. 17A/B, the inductor 1900A of FIG. 19A, and the resistor 1900B of FIG. 19B all have three nested loops, even though the metal traces that form each loop are not directly interconnected. Note that, although the resistor 1600 of FIG. 16 does not have nested loops, the resistor 1600 would be designed to have a resistance based on the resistance of its corresponding inductor, which may have nested loops.

In the embodiments of FIGS. 14-19B, the capacitor is connected to each resistor at a broken tap midway along the resistor's metal traces such that the capacitor leg (e.g., 412C of FIG. 4) is actually implemented by a series combination consisting of half of the resistor's metal traces having resistance $R_R/2$ connected in series to the capacitor having capacitance C connected in series to the other half of the resistor's metal traces also having resistance $R_R/2$. In some alternative embodiments, the resistor does not have a broken tap, and the capacitor leg (e.g., 412C of FIG. 4) is implemented by a series combination consisting of a first capacitor having capacitance 2C connected in series to the resistor having resistance $R_R$ connected in series to a second capacitor also having capacitance 2C. In other alternative embodiments, the resistor does not have a broken tap and a single capacitor having capacitance C is connected to one end of the resistor. Those skilled in the art will understand that the inductor L, the capacitor C, and/or the resistor R of the matched-resistance LC tank 412 of FIG. 4 can be implemented in many different ways having a wide variety of geometries.

Design Considerations

For the LC-based frequency reference generator 100 of FIG. 1, frequency inaccuracy due to process- and temperature-sensitive inductor loss ($R_L$) are ideally eliminated due to the matched-resistance LC tank 412. Since the residue temperature dependency of the resonant frequency (due to L and C) is almost process-insensitive, single-point temperature trim and batch calibration are sufficient to achieve frequency accuracy beyond ±0.1% (or even in the order of ±100 ppm) over the Automotive Grade-0 temperature range. As a result, a medium-resolution on-chip temperature sensor (e.g., 2-5° C.) may be used for the frequency-adjustment bias circuitry 420.

Referring again to FIG. 1, the frequency reference generator 100 has two main parts: (i) the LC-based frequency source 120 with well-behaved $TC_f$ over process and lifetime and (ii) the standalone frequency-adjustment circuitry 130 outside of the frequency source 120. To obtain well-defined $TC_f$ over process and time, the influence of doped semiconductors (such as poly-resistors, transistors, and diodes) on the oscillation frequency should to be minimized. Therefore, LC oscillators are employed since the oscillation frequency is mainly determined by the value of L and C, both of which can be easily implemented in the metal backend. Further, the $TC_f$ contribution from the temperature/process-sensitive quality factor of the LC tank is reduced, and the LC tank (e.g., 412 of FIG. 4) is non-trimmable to avoid lossy and PVT-sensitive tuning/switching components.

Nominal frequency trimming and temperature compensation outside of the frequency source 120 can be accomplished using the look-up tables 134 and 136 and the frequency divider 132 of FIG. 1. In addition, the process spread of $TC_f$ contributed by transistor parasitics (e.g., varying junction capacitance) is minimized. Consequently, the frequency reference generator 100 requires only 1T-trim per sample and batch calibration using a fixed temperature compensation polynomial or other suitable mapping.

At lower-GHz frequencies, the oscillation frequency $f_{osc}$ of the LC oscillator 400 of FIG. 4 (including the Groszkowski effect described in J. Groszkowski, "The Interdependence of Frequency Variation and Harmonic Content and the Problem of Constant-Frequency Oscillators", in *Proceedings of the Institute of Radio Engineers*, vol. 21, no. 7, pp. 958-981, July 1933, the teachings of which are incorporated herein by reference in their entirety) can be approximated as follows:

$$f_{osc} \approx \frac{1}{2\pi\sqrt{LC}}\sqrt{1-\frac{1}{Q_L^2}\sum_{n=2}^{\infty}f(h_n)} \quad (9)$$

where L is the inductance of the inductor L, C is the capacitance of the capacitor C, $Q_L$ is the quality factor for the inductor L, $f(h_n)$ is a term as a function of $h_n$, and $h_n = I_{Dn}/I_{D1}$ is the relative $n^{th}$-order harmonic content in the sustaining current $I_D$ shown in FIG. 4.

For the LC oscillator 400 of FIG. 4, the $TC_f$ contribution from the temperature-sensitive quality factor of the LC tank 412 is proportional to $2\epsilon/Q_L$. That is a 10× reduction for a relaxed resistance mismatch of 5%.

To minimize frequency drift due to the Groszkowski effect on $f_{osc}$, low amplitudes of $V_{osc}$ (e.g., <200 mV in a typical modern CMOS process) in steady state should be maintained to ensure that the driving devices $M_1$ and $M_2$ of FIG. 4 are kept close to their bias point. In practice, oscillation amplitude control is achieved by measuring the peak-detector output $V_{peak}$ and adjusting the bias current $I_{BIAS}(T)$ accordingly.

With the aforementioned design considerations and measures, the temperature-dependent tank inductance and capacitance dominate the residual $TC_f$. The effective tank capacitance is influenced by the PVT-sensitive parasitic capacitances of $M_1$ and $M_2$. $M_1$ and $M_2$ contain the parasitic bulk-drain junction diode $D_{DB}$, of which its capacitance $C_{DB}$ is PVT-sensitive and is in parallel with the tank capacitance C. As shown in FIG. 4, these dependencies of $C_{DB}$ are minimized by forcing a suitable sensed-temperature voltage $V_{NTAT}(T)$ on the sources of $M_1$ and $M_2$, implemented by the replica circuit of $M_5$, $M_6$ and the op-amp 424.

In summary, the frequency reference generator 100 of FIG. 1 can offer reduced design complexity/efforts, reduced test time/costs, and high frequency stability over PVT and lifetime, which can serve as a competitive candidate to replace crystal oscillators for many applications.

Alternative Embodiments

As used herein, the term "trimming" refers to an off-line, static adjustment made to circuitry that affects the on-line operations of that circuitry, while the term "compensation" refers to an on-line, dynamic adjustment made to circuitry that affects the on-line operations of that circuitry. Thus, the off-line generation of a sample-specific LUT for the frequency-adjustment circuitry 130 of FIG. 1 to account for process variation is an example of trimming, while the use of that sample-specific LUT during on-line operations of the frequency-adjustment circuitry 130 to account for temperature variation is an example of compensation. Similarly, the use of the bias circuitry 420 in the LC oscillator 400 of FIG. 4 to account for voltage and temperature variation is another example of compensation.

The frequency reference generator 100 of FIGS. 1-14 has temperature sensor 110, frequency source 120, and frequency-adjustment circuitry 130. The frequency source 120 has a non-trimmable driving devices $M_1$ and $M_2$, a non-trimmable LC tank 412, and bias circuitry 420 that compensates for voltage and temperature variation. The frequency-adjustment circuitry 130 is one-time (1T) trimmable for process variation and compensates for temperature variation. Those skilled in the art will understand that, in alternative embodiments, frequency reference generators of the disclosure may have trimmable driving devices $M_1$ and $M_2$ and/or a trimmable LC tank. For example, suitable trimming circuitry for a trimmable device driver $M_1$ may include a switchable transistor array with on/off switches implemented at the gate terminals. Suitable trimming circuitry for an LC tank may include two or more one-time programmable capacitors connected in parallel for the capacitors C of FIG. 4, where the LC tank 412 is 1T-trimmed by permanently connecting or disconnect each programmable capacitor to or from the LC tank. In certain implementations, the frequency error introduced by the trimming circuitry is at least one order of magnitude less than the frequency error of the untrimmed LC tank.

Although the described frequency source 120 comprises a peak detector 310 and a current source 422 that generates a bias current $I_{BIAS}(T)$ based on the detected peak voltage $V_{peak}$ in the LC signal 303a/b, in other embodiments, other suitable types of amplitude detectors and amplitude-based bias current sources may be employed.

Although the described LC oscillator 400 of FIG. 4 comprises current-mirror circuitry 420, in alternative embodiments, other suitable circuitry may be used to drive a current into the driving devices $M_1$ and $M_2$ based on the bias current.

Although the disclosure has been described in the context of an oscillator having N-type MOS transistors $M_1$ and $M_2$, in alternative embodiments, P-type or complementary MOS (e.g., both N-type and P-type) transistors may be used as driving devices, along with adjusted current-mirror circuitry.

According to certain embodiments, the disclosure describes an article of manufacture comprising an LC oscillator comprising an LC tank and a tank driver. The LC tank has an inductor leg in parallel with a capacitor leg, wherein the inductor leg comprises an explicit inductor having an implicit resistance level $R_L$, and the capacitor leg comprising an explicit capacitor having an implicit resistance level $R_C$ connected in series with an explicit resistor having an explicit resistance level $R_R$, wherein $R_M = (R_C + R_R)$ is substantially equal to $R_L$. The tank driver causes the LC tank to oscillate, thereby generating an oscillator clock signal.

According to at least some and possibly all of the above embodiments, the LC oscillator is implemented in a multi-layer integrated circuit and the explicit resistor is implemented using a backend metal layer of the integrated circuit.

According to at least some and possibly all of the above embodiments, the explicit resistor is implemented using interconnected metal traces having a broken center tap at a central region defined by the metal traces, and the explicit capacitor is connected to the broken center tap of the explicit resistor and implemented in the central region defined by the metal traces.

According to at least some and possibly all of the above embodiments, the explicit resistor is implemented using interconnected metal traces, and the explicit capacitor is implemented as one or two capacitors connected to one or both ends of the explicit resistor.

According to at least some and possibly all of the above embodiments, the explicit resistor is implemented using interconnected, folded metal traces that form adjacent arms having currents flowing in opposite directions.

According to at least some and possibly all of the above embodiments, the explicit inductor comprises metal traces forming a number of nested loops, and the explicit resistor comprises metal traces forming a number of nested loops equal to the number of nested loops in the explicit inductor.

According to at least some and possibly all of the above embodiments, in the explicit inductor, currents in adjacent loops flow in a common direction, and, in the explicit resistor, currents in adjacent loops flow in opposite directions.

According to at least some and possibly all of the above embodiments, the explicit resistor has an outer dimension larger than an outer dimension of the explicit inductor to compensate for different proximity effects due to differences in adjacent current flow directions between the explicit inductor and the explicit resistor.

According to at least some and possibly all of the above embodiments, the LC oscillator is implemented in a multi-layer integrated circuit, and most of the metal traces of the explicit inductor and most of the metal traces of the explicit resistor are formed in a single backend metal layer of the integrated circuit.

According to at least some and possibly all of the above embodiments, the explicit inductor further comprises one or more cross-over regions to avoid physical contact between overlapping traces, and the explicit resistor further comprises one or more cross-over regions to match the resistances of the one or more cross-over regions in the explicit inductor.

According to at least some and possibly all of the above embodiments, the explicit inductor and the explicit resistor are tapered such that (i) inner loops are thinner than outer loops and (ii) inter-loop distance is greater for adjacent inner loops than for adjacent outer loops.

According to at least some and possibly all of the above embodiments, wherein $R_M$ and $R_L$ are within 5% of each other.

According to at least some and possibly all of the above embodiments, the tank driver is a cross-coupled transconductance stage configured to generate the oscillator clock signal as a differential signal.

According to at least some and possibly all of the above embodiments, wherein the LC tank is non-trimmable.

According to at least some and possibly all of the above embodiments, further comprising frequency adjustment circuitry connected to receive the oscillator clock signal from the LC oscillator and divide the oscillator clock signal by a specified divisor to generate a reference clock signal.

It is further noted that the functional blocks, components, systems, devices, or circuitry described herein can be implemented using hardware, software, or a combination of hardware and software as needed. For example, the disclosed embodiments can be implemented using one or more integrated circuits that are programmed to perform the functions, tasks, methods, actions, or other operational features described herein for the disclosed embodiments. The one or more integrated circuits can include, for example, one or more processors or configurable logic devices (CLDs) or a combination thereof. The one or more processors can be, for example, one or more central processing units (CPUs), controllers, microcontrollers, microprocessors, hardware accelerators, ASICs (application specific integrated circuit), or other integrated processing devices. The one or more CLDs can be, for example, one or more CPLDs (complex programmable logic devices), FPGAs (field programmable gate arrays), PLAs (programmable logic array), reconfigurable logic circuits, or other integrated logic devices. Further, the integrated circuits, including the one or more processors, can be programmed to execute software, firmware, code, or other program instructions that are embodied in one or more non-transitory tangible computer-readable mediums to perform the functions, tasks, methods, actions, or other operational features described herein for the disclosed embodiments. The integrated circuits, including the one or more CLDs, can also be programmed using logic code, logic definitions, hardware description languages, configuration files, or other logic instructions that are embodied in one or more non-transitory tangible computer-readable mediums to perform the functions, tasks, methods, actions, or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, or any other non-transitory tangible computer-readable mediums. Other variations can also be implemented while still taking advantage of the techniques described herein.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An article of manufacture comprising an LC oscillator comprising:
an LC tank having an inductor leg in parallel with a capacitor leg, wherein:
the inductor leg comprises an explicit inductor having an implicit resistance level $R_L$; and
the capacitor leg comprising an explicit capacitor having an implicit resistance level $R_C$ connected in series with an explicit resistor having an explicit resistance level $R_R$, wherein $R_M=(R_C+R_R)$ is substantially equal to $R_L$; and
a tank driver connected to cause the LC tank to oscillate, thereby generating an oscillator clock signal.

2. The article of claim 1, wherein the LC oscillator is implemented in a multi-layer integrated circuit and the explicit resistor is implemented using a backend metal layer of the integrated circuit.

3. The article of claim 1, wherein:
the explicit resistor is implemented using interconnected metal traces having a broken center tap at a central region defined by the metal traces; and
the explicit capacitor is connected to the broken center tap of the explicit resistor and implemented in the central region defined by the metal traces.

4. The article of claim 1, wherein:
the explicit resistor is implemented using interconnected metal traces; and
the explicit capacitor is implemented as one or two capacitors connected to one or both ends of the explicit resistor.

5. The article of claim 1, wherein the explicit resistor is implemented using interconnected, folded metal traces that form adjacent arms having currents flowing in opposite directions.

6. The article of claim 1, wherein:
the explicit inductor comprises metal traces forming a number of nested loops; and
the explicit resistor comprises metal traces forming a number of nested loops equal to the number of nested loops in the explicit inductor.

7. The article of claim 6, wherein:
in the explicit inductor, currents in adjacent loops flow in a common direction; and
in the explicit resistor, currents in adjacent loops flow in opposite directions.

8. The article of claim 7, wherein the explicit resistor has an outer dimension larger than an outer dimension of the explicit inductor to compensate for different proximity effects due to differences in adjacent current flow directions between the explicit inductor and the explicit resistor.

9. The article of claim 6, wherein:
the LC oscillator is implemented in a multi-layer integrated circuit; and
most of the metal traces of the explicit inductor and most of the metal traces of the explicit resistor are formed in a single backend metal layer of the integrated circuit.

10. The article of claim 9, wherein:
the explicit inductor further comprises one or more cross-over regions to avoid physical contact between overlapping traces; and
the explicit resistor further comprises one or more cross-over regions to match the resistances of the one or more cross-over regions in the explicit inductor.

11. The article of claim 6, wherein the explicit inductor and the explicit resistor are tapered such that (i) inner loops are thinner than outer loops and (ii) inter-loop distance is greater for adjacent inner loops than for adjacent outer loops.

12. The article of claim 1, wherein $R_M$ and $R_L$ are within 5% of each other.

13. The article of claim 1, wherein the tank driver is a cross-coupled transconductance stage configured to generate the oscillator clock signal as a differential signal.

14. The article of claim 1, wherein the LC tank is non-trimmable.

15. The article of claim 1, further comprising frequency adjustment circuitry connected to receive the oscillator clock signal from the LC oscillator and divide the oscillator clock signal by a specified divisor to generate a reference clock signal.

* * * * *